US011925089B2

(12) United States Patent
Koshihara

(10) Patent No.: US 11,925,089 B2
(45) Date of Patent: Mar. 5, 2024

(54) ELECTRO-OPTICAL DEVICE AND ELECTRONIC DEVICE

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 18/133,803

(22) Filed: Apr. 12, 2023

(65) Prior Publication Data

US 2023/0247885 A1    Aug. 3, 2023

Related U.S. Application Data

(63) Continuation of application No. 16/039,623, filed on Jul. 19, 2018, now Pat. No. 11,659,752.

(30) Foreign Application Priority Data

Jul. 31, 2017   (JP) ................................. 2017-147405

(51) Int. Cl.
| H10K 59/35 | (2023.01) |
| G09G 3/3233 | (2016.01) |
| H10K 59/123 | (2023.01) |
| H10K 59/38 | (2023.01) |
| H10K 50/856 | (2023.01) |

(52) U.S. Cl.
CPC ......... *H10K 59/353* (2023.02); *G09G 3/3233* (2013.01); *H10K 59/123* (2023.02); *H10K 59/351* (2023.02); *H10K 59/38* (2023.02); *G09G 2300/0452* (2013.01); *G09G 2300/0842* (2013.01); *H10K 50/856* (2023.02)

(58) Field of Classification Search
None
See application file for complete search history.

(56) References Cited

U.S. PATENT DOCUMENTS

| 10,162,222 B2 | 12/2018 | Chae et al. |
| 10,340,428 B2 | 7/2019 | Koshihara |
| 2006/0289882 A1 | 12/2006 | Nishimura et al. |
| 2009/0289963 A1 | 11/2009 | Minami et al. |

(Continued)

FOREIGN PATENT DOCUMENTS

| JP | 2006-210845 A | 8/2006 |
| JP | 2009-282190 A | 12/2009 |

(Continued)

*Primary Examiner* — Michelle Mandala
(74) *Attorney, Agent, or Firm* — Oliff PLC

(57) ABSTRACT

An electro-optical device comprising a plurality of pixels. Each of the plurality of pixels includes a first sub pixel and a second sub pixel that are arrayed in the first direction, a third sub pixel and a fourth sub pixel that are arrayed in the first direction, and a color filter corresponding to each of the first sub pixel, the second sub pixel, the third sub pixel, and the fourth sub pixel. Each of the first sub pixel, the second sub pixel, the third sub pixel, and the fourth sub pixel including a light-emitting element includes a light-emitting region, a supply circuit for supplying current to the light-emitting element, and a contact region in which a contact for electrically connecting the light-emitting element to the supply circuit is disposed.

5 Claims, 21 Drawing Sheets

(56) References Cited

U.S. PATENT DOCUMENTS

| | | |
|---|---|---|
| 2013/0234917 A1 | 9/2013 | Lee |
| 2015/0162394 A1 | 6/2015 | Tokuda et al. |
| 2016/0071910 A1 | 3/2016 | Sasaki et al. |
| 2016/0195746 A1 | 7/2016 | Hong et al. |
| 2016/0322437 A1 | 11/2016 | Sakamoto et al. |
| 2016/0380037 A1 | 12/2016 | Kajiyama |
| 2017/0146855 A1* | 5/2017 | Park .................... G09G 3/3648 |
| 2017/0207287 A1* | 7/2017 | Matsunaga .......... H10K 59/124 |
| 2018/0011371 A1* | 1/2018 | Noh ...................... H01L 27/124 |
| 2018/0031893 A1* | 2/2018 | Tamaki ............. G02F 1/133504 |
| 2018/0107028 A1 | 4/2018 | Jung et al. |
| 2018/0138376 A1 | 5/2018 | Koshihara |
| 2018/0219050 A1 | 8/2018 | Ota et al. |
| 2021/0066400 A1 | 3/2021 | Dong et al. |

FOREIGN PATENT DOCUMENTS

| | | |
|---|---|---|
| JP | 2015-108751 A | 6/2015 |
| JP | 2016-057488 A | 4/2016 |
| JP | 2016-170935 A | 9/2016 |
| JP | 2016-212979 A | 12/2016 |
| JP | 2017-009884 A | 1/2017 |

* cited by examiner

ELECTRO-OPTICAL DEVICE AND ELECTRONIC DEVICE

This is a Continuation of application Ser. No. 16/039,623 filed Jul. 19, 2018, which claims the benefit of Japanese Patent Application No. 2017-147405 filed Jul. 31, 2017. The disclosure relates to an electro-optical device and an electronic device. The disclosure of the prior applications is hereby incorporated by reference herein in its entirety.

BACKGROUND

1. Technical Field

According to an electro-optical device including a light-emitting element, such as an organic electroluminescent (EL) element, a structure is known in which a color filter transmitting light in a desired wavelength region is included on a sealing layer covering the light-emitting element in order to achieve color display. Further, according to such an electro-optical device, one display is typically formed with pixels including a plurality of sub pixels.

2. Related Art

Furthermore, a sub pixel provided in the electro-optical device includes a light-emitting element having a light-emitting region, a supply circuit outputting electric power to be supplied to the light-emitting element, and a contact region for electrically connecting the supply circuit to the light-emitting element. For example, JP-A-2009-282190 discloses an electro-optical device in which one pixel is formed with three sub pixels of primary colors in red, green, and blue. JP-A-2009-282190 states that the light-emitting element is electrically connected to the supply circuit through a contact region in the electro-optical device.

Incidentally, the arrangement of the sub pixels are designed to be arrayed such that the aperture ratio is increased by enlarging the size of the light-emitting element. Thus, the light-emitting element is disposed to have a size that is as large as possible. However, the contact region is provided between the light-emitting elements arrayed to have a size that is as large as possible, and there exist, in the above-described electro-optical device, a portion at which the light-emitting elements of the sub pixels are located adjacent to each other through the contact region and a portion at which the light-emitting elements of the sub pixels are located adjacent to each other without the contact region being interposed. Accordingly, in a case where each color filter is disposed on each light-emitting element, the distance between a light-emitting element of one sub pixel and a color filter located adjacent to the one sub pixel varies between the sub pixels. In a case where the above-described distance varies between the sub pixels, for one viewing angle, when light emitted from a light-emitting element of one sub pixel passes through a color filter located adjacent to the one sub pixel and a change in color occurs, the light emitted from the light-emitting element of another sub pixel may not pass through the color filter located adjacent to the sub pixel above and a change in color may not occur. As described above, in a case where the distance between the light-emitting element of the one sub pixel and the color filter located adjacent to the one sub pixel varies between the sub pixels, a variation in color change may occur depending on the viewing angle.

SUMMARY

According to the disclosure, a variation in color change depending on a viewing angle is suppressed even when an aperture ratio is increased.

An electro-optical device according to one aspect of the disclosure includes a plurality of pixels arrayed in a first direction and a second direction intersecting with the first direction, each of the plurality of pixels including a first sub pixel and a second sub pixel that are arrayed in the first direction, a fourth sub pixel and a third sub pixel that are arrayed in the first direction, the fourth sub pixel and the first sub pixel being arrayed in the second direction, and the third sub pixel and the second sub pixel being arrayed in the second direction, and a color filter corresponding to each of the first sub pixel, the second sub pixel, the third sub pixel, and the fourth sub pixel, each of the first sub pixel, the second sub pixel, the third sub pixel, and the fourth sub pixel including a light-emitting element including a light-emitting region, a supply circuit for supplying current to the light-emitting element, and a contact region in which a contact for electrically connecting the light-emitting element to the supply circuit is disposed, and the contact region overlapping with an intersection point of boundary lines that partition the light-emitting region provided in each of the first sub pixel, the second sub pixel, the third sub pixel, and the fourth sub pixel.

According to one aspect of the disclosure, the intersection point of the boundary lines that partition each light-emitting region is located away from the center of each light-emitting region, and thus a size reduction of the light-emitting region is suppressed by providing the contact region.

Furthermore, the contact region is disposed to overlap with the intersection point, and thus the contact region is able to be disposed on a part of an adjacent sub pixel. Further, the contact region of the sub pixel is disposed on a part of one sub pixel and a part of the adjacent sub pixel, and the contact region is disposed across a boundary line. Accordingly, the contact region is disposed at equal intervals among the sub pixels, and the intervals between the light-emitting regions are equal. The intervals between the light-emitting regions are equal, and thus the variation in color change depending on the viewing angle is suppressed. As described above, the variation in color change depending on the viewing angle is suppressed while the reduction of the light-emitting region is suppressed.

An electro-optical device according to one aspect of the disclosure includes a plurality of pixels arrayed in a first direction and a second direction intersecting with the first direction, each of the plurality of pixels including a first sub pixel and a second sub pixel that are arrayed in the first direction, and a fourth sub pixel and a third sub pixel that are arrayed in the first direction, the fourth sub pixel and the first sub pixel being arrayed in the second direction, and the third sub pixel and the second sub pixel being arrayed in the second direction, and including a color filter corresponding to each of the first sub pixel, the second sub pixel, the third sub pixel, and the fourth sub pixel, each of the first sub pixel, the second sub pixel, the third sub pixel, and the fourth sub pixel including a light-emitting element having a light-emitting region and a supply circuit for supplying current to the light-emitting element, and the light-emitting region interiorly including a contact region in which a contact for electrically connecting the supply circuit to the light-emitting element is disposed.

According to one aspect of the disclosure, the contact region is disposed inside the light-emitting region and the contact region is not disposed outside the light-emitting region, and thus the interval between the light-emitting regions is able to be prevented from varying due to the presence of the contact region. Accordingly, the intervals between the light-emitting regions are equalized, and thus the variation in color change depending on the viewing angle is suppressed.

Alternatively, according to the above aspect, a distance between a light-emitting region of a second sub pixel and a light-emitting region of a first sub pixel in one pixel may be substantially equal to a distance between the light-emitting region of the second sub pixel of the one pixel and a light-emitting region of a first sub pixel of a pixel located adjacent to the one pixel in the first direction, and a distance between a light-emitting region of a third sub pixel and a light-emitting region of a fourth sub pixel in the one pixel may be substantially equal to a distance between the light-emitting region of the third sub pixel of the one pixel and a light-emitting region of a fourth sub pixel of a pixel located adjacent to the one pixel in the first direction.

According to the above aspect, the distance between a light-emitting region of the first sub pixel and a light-emitting region of the second sub pixel in the one pixel is substantially equal to the distance between the light-emitting region of the second sub pixel of the one pixel and a light-emitting region of a first sub pixel of the pixel located adjacent to the one pixel in the first direction, and thus the distance between the light-emitting region of the first sub pixel and an end portion of a color filter of a pixel located adjacent to the first sub pixel in the first direction is substantially equal to the distance between the light-emitting region of the second sub pixel and an end portion of a color filter of a pixel located adjacent to the second sub pixel in the first direction. The above two distances are substantially equal to each other, and the variation in color change in the first direction occurs at substantially identical viewing angles, and thus the variation in color change depending on the viewing angle in the first direction, the variation being caused by the variation in the distances between the light-emitting regions arrayed in the first direction, is suppressed.

Alternatively, according to the above aspect, a distance between a light-emitting region of a fourth sub pixel and a light-emitting region of a first sub pixel in one pixel may be substantially equal to a distance between the light-emitting region of the fourth sub pixel of the one pixel and a light-emitting region of a first sub pixel of a pixel located adjacent to the one pixel in the second direction, and a distance between a light-emitting region of a third sub pixel and a light-emitting region of a second sub pixel in the one pixel may be substantially equal to a distance between the light-emitting region of the third sub pixel of the one pixel and a light-emitting region of a second sub pixel of a pixel located adjacent to the one pixel in the second direction.

According to the above aspect, in a similar manner as in the first direction, the variation in color change depending on the viewing angle in the second direction, the variation being caused by the variation in the distances between the light-emitting regions arrayed in the second direction, is suppressed.

Alternatively, according to the above aspect, a relationship between color of one sub pixel among the first sub pixel, the second sub pixel, the third sub pixel, and the fourth sub pixel, and color of a sub pixel disposed in the first direction with respect to the one sub pixel, may be uniquely determined in accordance with the color of the one sub pixel.

Typically in a case where the color of the color filters located in one direction with respect to the sub pixels of identical colors varies, light emitted from sub pixels of identical colors each causes different color changes when a color change occurs depending on the viewing angle in one direction, and the color change depending on the viewing angle varies. On the other hand, according to the above aspect, the relationship between the color of one sub pixel and the color of the sub pixel disposed in the first direction with respect to the one sub pixel is uniquely determined in accordance with the color of the one sub pixel, and thus the color of the color filter located in the first direction with respect to the sub pixel of the identical color is uniquely determined. Accordingly, a uniquely determined color change occurs in sub pixels of identical colors when a color change occurs depending on one viewing angle in the first direction, and thus the variation in the color of the color filter located in the first direction, the variation being caused by the variation in color change depending on the viewing angle in the first direction, is suppressed.

Alternatively, according to the above aspect, the relationship between the color of one sub pixel among the first sub pixel, the second sub pixel, the third sub pixel, and the fourth sub pixel, and the color of the sub pixel disposed in the second direction with respect to the one sub pixel, may be uniquely determined in accordance with the color of the one sub pixel.

According to the above aspect, in a similar manner as in the first direction, the variation in color change depending on the viewing angle in the second direction, the variation being caused by the variation in the color of the color filter disposed in the second direction, is suppressed.

Alternatively, according to the above aspect, when a direction inclined at a first angle with respect to the first direction and inclined at a second angle with respect to the second direction is defined as a third direction, the contact regions are arrayed in the third direction, and each of the first sub pixel, the second sub pixel, the third sub pixel, and the fourth sub pixel includes a reflective electrode electrically connected to the supply circuit, an intermediate electrode, and a pixel electrode, and a first contact for electrically connecting the reflective electrode to the intermediate electrode and a second contact for electrically connecting the intermediate electrode to the pixel electrode may be disposed in the contact region.

According to the above aspect, two contacts are disposed within one contact region and the two contacts are concentrated at one location, and thus the distance between the two contacts is shortened and the wiring is able to be smoothly performed. In addition, the two contacts are concentrated at one location, and thus the contact region is narrowed, ensuring a wider light-emitting region.

Alternatively, according to the above aspect, when a direction inclined at the first angle with respect to the first direction and inclined at the second angle with respect to the second direction is defined as a third direction, the distance between the light-emitting region of one sub pixel among the first sub pixel, the second sub pixel, the third sub pixel, and the fourth sub pixel and the light-emitting region of a sub pixel disposed in the third direction with respect to the one sub pixels, may be constant.

According to the above aspect, in a similar manner as in the first and second directions, the variation in color change depending on the viewing angle in the third direction, the variation being caused by the variation in the distance between the light-emitting regions arrayed in the third direction, is suppressed.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Some exemplary embodiments of a printing apparatus are described below while referencing the accompanying drawings. Note that, in each drawing, the dimension and the scale of each portion are appropriately changed from the actual dimension and scale. In addition, various technical limitations are given to the exemplary embodiments described below because the exemplary embodiments are some specific examples of a present technology, however, the scope of the disclosure is not particularly limited to the exemplary embodiments unless stated in the following descriptions.

Exemplary Embodiment

Hereafter, the electro-optical device 1 of some exemplary embodiments will be described.

Outline of Electro-Optical Device

Figure 1:
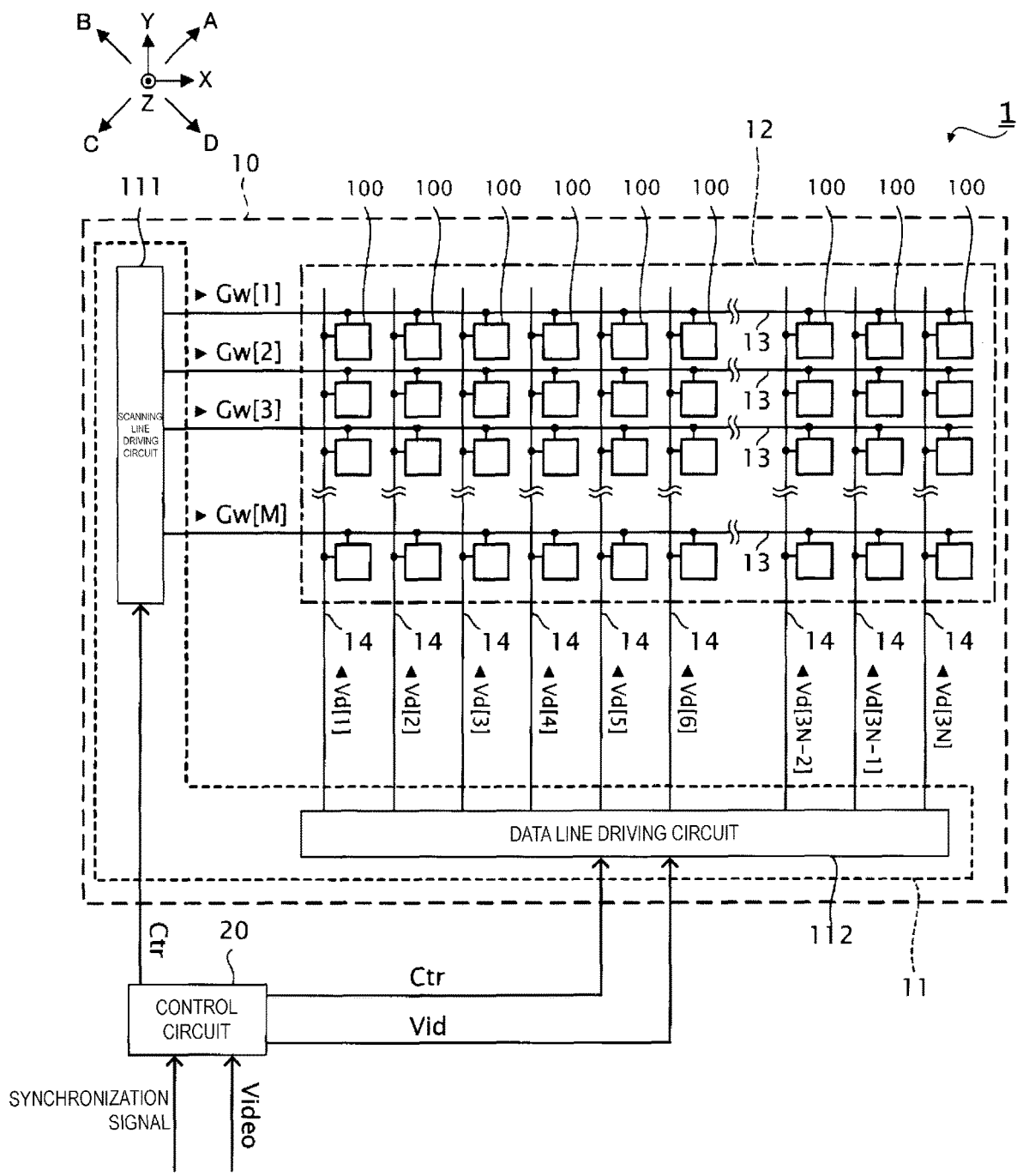
FIG. 1 is a block diagram illustrating an example of a structure of an electro-optical device 1 according to some exemplary embodiments.

FIG. 1 is a block diagram illustrating an example of the structure of the electro-optical device 1 according to some exemplary embodiments. As exemplified in FIG. 1, the electro-optical device 1 includes a display panel 10 and a control circuit 20. The display panel 10 includes a plurality of sub pixels Px. The control circuit 20 controls operation of the display panel 10.

Digital image data video is transmitted, from a host device that is not depicted, to the control circuit 20 in synchronization with a synchronization signal. Note that herein, image data video is digital data that defines a gradation level to be displayed by each of the sub pixels Px of the display panel 10. In addition, the synchronization signal includes a vertical synchronization signal, a horizontal synchronization signal, a dot clock signal, and the like. The control circuit 20 generates a control signal Ctr for controlling the operation of the display panel 10 based on the synchronization signal, and transmits the generated control signal Ctr to the display panel 10. In addition, the control circuit 20 generates an analog image signal Vid based on the image data video and transmits a generated image signal Vid to the display panel 10. Note that herein, the image signal Vid regulates the luminance of the light-emitting element of the sub pixel Px such that each of the sub pixels Px displays the gradation specified by the image data video.

As exemplified in FIG. 1, the display panel 10 includes M pieces of scanning lines 13 extending in a +X direction, 3N pieces of data lines 14 extending in a +Y direction, a display 12 including "M×3N pieces" of pixel circuits 100 arrayed corresponding to the intersections of the M pieces of the scanning lines 13 with the 3N pieces of the data lines 14, and a drive circuit 11 for driving the display 12 (M is a natural number greater than or equal to 1, N is a natural number greater than or equal to 1). Hereafter, in order to distinguish the plurality of sub pixels Px, the plurality of scanning lines 13, and the plurality of data lines 14 from one another, rows are referred to as a first row, a second row, . . . , an M-th row in this order from the +Y direction to a −Y direction (hereafter, the +Y direction and the −Y direction are collectively referred to as a "Y-axis direction"), columns are referred to as a first column, a second column, . . . , a 3N-th column in this order from a −X direction to the +X direction (hereafter, the +X direction and the −X direction are collectively referred to as an "X-axis direction"). Further, in the following description, a +Z direction (upward direction) and a −Z direction (downward direction) intersecting with the X-axis direction and the Y-axis direction are collectively referred to as a "Z-axis direction". Furthermore, as depicted in FIG. 1, the +X direction and the plus +Y direction are referred to as a "direction A", the −X direction and the +Y direction are referred to as a "direction B", the −X direction and the −Y direction are referred to as a "direction C", and the +X direction and the −Y direction are referred to as a "direction D".

A plurality of pixel circuits 100 provided in the display 12 includes a pixel circuit 100 capable of displaying red (abbreviated as R), a pixel circuit 100 capable of displaying green (abbreviated as G), and a pixel circuit 100 capable of displaying blue (abbreviated as B). Furthermore, in one exemplary embodiment, it is assumed in one example that, among the first column to the 3N-th column, the pixel circuit 100 capable of displaying R is disposed in a (3n−2)-th column, the pixel circuit 100 capable of displaying G is disposed in a (3n−1)-th column, and the pixel circuit 100 capable of displaying B is disposed in a 3n-th column, where n is a natural number satisfying 1≤n≤N. As exemplified in FIG. 1, a driving circuit 11 includes a scanning line driving circuit 111 and a data line driving circuit 112.

The scanning line driving circuit 111 sequentially scans (selects) the scanning lines 13 of the first row to the M-th row. Specifically, the scanning line driving circuit 111 sequentially sets, in one frame period, scanning signals Gw[1] to Gw[M] to be output to each of the scanning lines 13 of the first row to the M-th row to predetermined selection electrical potentials for each horizontal scanning period, and then sequentially selects the scanning lines 13 in units of rows for each horizontal scanning period. In other words, the scanning line driving circuit 111 sets the scanning signal Gw[m] to be output to the scanning line 13 of an m-th row to a predetermined selection electrical potential during an m-th horizontal scanning period of a one frame period, and thus selects the scanning line 13 of the m-th row. Note that the one frame period is a period during which the electro-optical device 1 displays one image.

The data line driving circuit 112 generates, based on the image signal Vid and the control signal Ctr transmitted from the control circuit 20, analog data signals Vd[1] to Vd[3N] that define the gradations to be displayed by each pixel circuit 100, and outputs generated data signals Vd[1] to Vd[3N] to the 3N pieces of data lines 14 for each horizontal scanning period. In other words, the data line driving circuit 112 outputs a data signal Vd[k] to a data line 14 of a k-th column in each horizontal scanning period. Note that, in one exemplary embodiment, although the image signal Vid to be output from the control circuit 20 is an analog signal, the image signal Vid to be output from the control circuit 20 may be a digital signal. In this case, the data line driving circuit 112 D/A-converts the image signals Vid to the analog data signals Vd[1] to Vd[3N].

Figure 2:
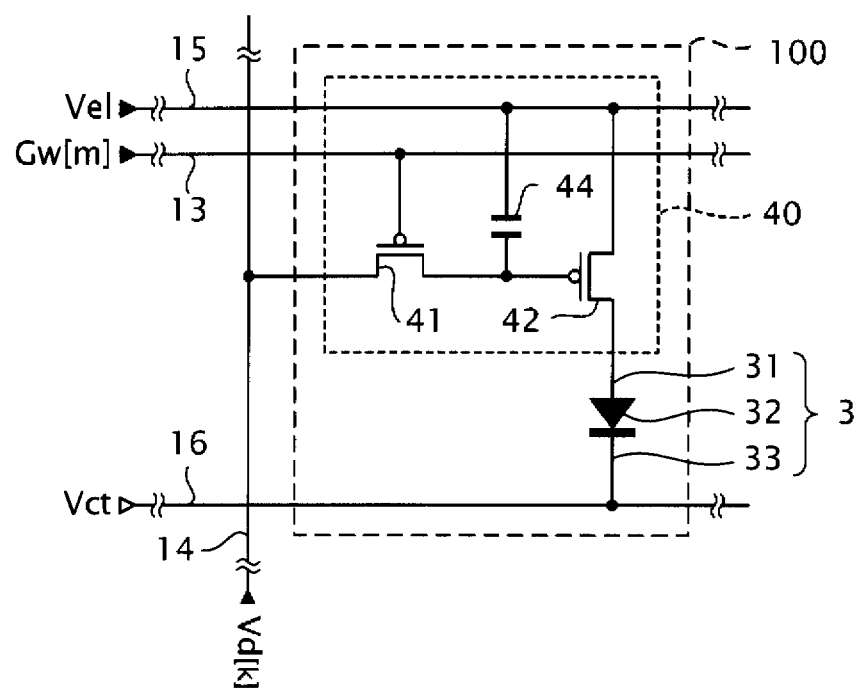
FIG. 2 is an equivalent circuit diagram illustrating an example of a structure of a pixel circuit 100.

FIG. 2 is an equivalent circuit diagram illustrating an example of the structure of the pixel circuit 100. FIG. 2 exemplifies the pixel circuit 100 in the m-th row and the k-th column.

The pixel circuit 100 includes a light-emitting element 3 and a supply circuit 40 for outputting a current to be supplied to the light-emitting element 3.

The light-emitting element 3 includes a pixel electrode 31, a light-emitting function layer 32, and a counter electrode 33. The pixel electrode 31 functions as a positive electrode for supplying holes to the light-emitting function layer 32. The counter electrode 33 is electrically connected to a feed line 16 that is set at a voltage potential Vct that is a power-supply voltage on a low voltage potential side of the pixel circuit 100, and functions as a negative electrode for supplying electrons to the light-emitting function layer 32. The holes supplied by the pixel electrode 31 and the electrons supplied by the counter electrode 33 are then coupled in the light-emitting function layer 32, and the light-emitting function layer 32 emits white light. As will be described later in detail, a color filter 81R colored in red is disposed to overlay the light-emitting element 3 (hereafter referred to as light-emitting element 3R) included in the pixel circuit 100 capable of emitting R light. A color filter 81B colored in blue is disposed to overlay the light-emitting element 3 (hereafter referred to as light-emitting element 3B) included in the pixel circuit 100 capable of emitting B light. Furthermore, a color filter 81G colored in green is disposed to overlay a light-emitting element 3 (hereafter referred to as light-emitting element 3G) included in the pixel circuit 100 capable of emitting G light. Accordingly, a full color display is enabled using the light-emitting elements 3R, 3B, and 3G.

The supply circuit 40 includes P-channel type transistors 41 and 42, and a holding capacitor 44. Note that one or both of the transistors 41 and 42 may be an N-channel type transistor. Also note that, in one exemplary embodiment, although a case where the transistors 41 and 42 are thin film transistors is exemplified, the transistors 41 and 42 may be field effect transistors, such as metal-oxide-semiconductor field-effect transistors (MOSFET).

The gate of the transistor 41 is electrically connected to the scanning line 13 of the m-th row, and one of the source and the drain of the transistor 41 is electrically connected to the data line 14 of the k-th column. The other of the source and the drain of the transistor 41 is electrically connected to the gate of the transistor 42 and one of two electrodes of the holding capacitor 44. The gate of the transistor 42 is electrically connected to the other of the source and the drain of the transistor 41 and one electrode of the holding capacitor 44. One of the source and the drain of the transistor 42 is electrically connected to the pixel electrode 31. The other of the source and the drain of the transistor 42 is electrically connected to a power supply line 15 that is set to a voltage potential Vel that is a power-supply voltage on a high voltage potential side of the pixel circuit 100. The one electrode of the two electrodes of the holding capacitor 44 is electrically connected to the other of the source and the drain of the transistor 41 and the gate of the transistor 42. The other electrode of the two electrodes of the holding capacitor 44 is electrically connected to the power supply line 15. The holding capacitor 44 functions to hold a voltage potential of the gate of the transistor 42.

The scanning line driving circuit 111 sets the scanning signal Gw[m] to a predetermined selection electrical potential and selects the scanning line 13 of the m-th row, and the transistor 41 provided at the sub pixel Px[m][k] of the m-th row and the k-th column is then turned on. Furthermore, when the transistor 41 is turned on, the data signal Vd[k] is transmitted from the data line 14 of the kth column to the gate of the transistor 42. In this case, the transistor 42 supplies current to the light-emitting element 3 in accordance with the voltage potential, more precisely, in accordance with a difference of the voltage potential between the gate and the source, of the data signal Vd[k] transmitted to the gate. In other words, the transistor 42 is a driving transistor for supplying a current to the light-emitting element 3. The light-emitting element 3 emits light with luminance in accordance with a magnitude of the current supplied from the transistor 42, in other words, with the luminance in accordance with the voltage potential of the data signal Vd[k]. Subsequently, when the scanning line driving circuit 111 releases the selection of the scanning line 13 of the m-th row and the transistor 41 is turned off, the voltage potential of the gate of the transistor 42 is retained by the holding capacitor 44. Accordingly, even after the transistor 41 has turned off, the light-emitting element 3 is able to emit light with the luminance in accordance with the data signal Vd[k].

Figure 3:
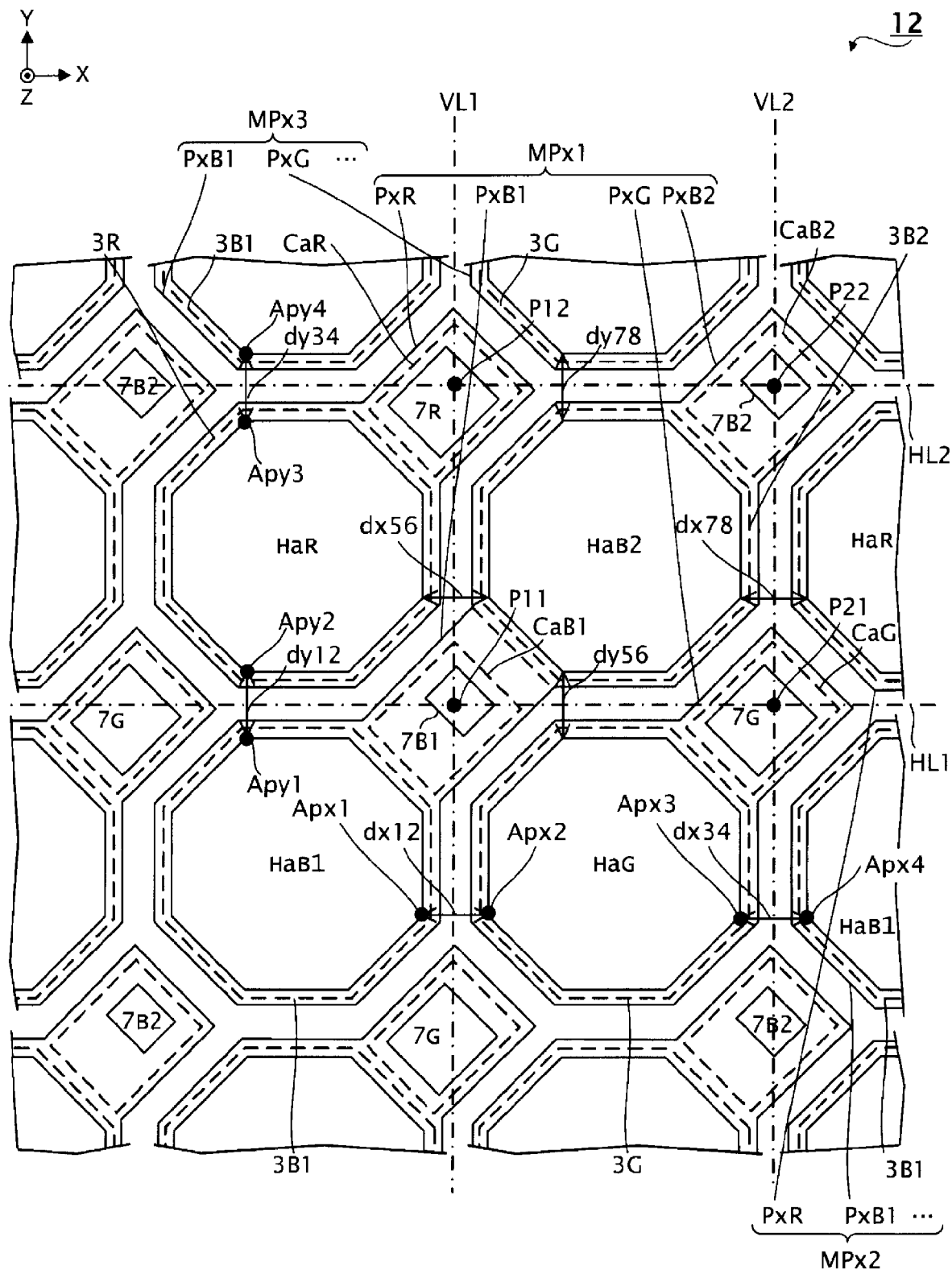
FIG. 3 is a plan view illustrating a first example of a structure of a display 12.

Although not depicted in FIG. 2, a component that electrically connects the pixel electrode 31 of the light-emitting element 3 to the supply circuit 40 is referred to as a contact 7 (refer to FIG. 3). Each of the sub pixels Px includes the light-emitting element 3, the supply circuit 40, and a contact region Ca in which the contact 7 is disposed.

The contact region Ca is a region in which the contact 7 is able to be disposed. The contact 7 electrically connects the pixel electrode 31 included in the light-emitting element 3 to the supply circuit 40. Hereafter, there are cases when the contact 7 provided in a sub pixel PxR is referred to as a contact 7R, the contact 7 provided in a sub pixel PxG is referred to as a contact 7G, and the contact 7 provided in a sub pixel PxB is referred to as a contact 7B. In addition, the contact region Ca in which the contact 7R is disposed may be referred to as a contact region CaR, the contact region Ca in which the contact 7G is disposed may be referred to as a contact region CaG, and the contact region Ca in which the contact 7B is disposed may be referred to as a contact region CaB.

Structure of Display

Hereafter, an example of the structure of the display 12 of some exemplary embodiments will be described with reference to FIGS. 3 to 6.

FIG. 3 is a plan view illustrating an example of a schematic structure of the display 12 when a part of the display 12 of some exemplary embodiments is viewed from the +Z direction in which the electro-optical device 1 emits light. Note that the plan view of FIG. 3 is illustrated excluding the color filter 81 to make the drawing more understandable. Two contacts 7 are disposed in each of the contact regions CaR and CaG, and in the plan view of FIG. 3, the two contacts 7 are collectively depicted as a single contact 7 in a simple manner to make the drawing more understandable.

Specifically, FIG. 3 illustrates the sub pixel PxR, the sub pixel PxG, a sub pixel PxB1, and a sub pixel PxB2 that form one pixel MPx1 in the display 12. The sub pixel PxR includes the light-emitting element 3R in the pixel circuit 100 capable of displaying R. The sub pixel PxG includes the light-emitting element 3G in the pixel circuit 100 capable of displaying G. The sub pixel PxB1 includes a light-emitting element 3B1 in the pixel circuit 100 capable of displaying B. The sub pixel PxB2 includes a light-emitting element 3B2 in the pixel circuit 100 capable of displaying B. Furthermore, current is supplied from the supply circuit 40, included in an identical pixel circuit 100, to the sub pixel PxB1 and the sub pixel PxB2.

As depicted in FIG. 3, the sub pixel PxB1 and the sub pixel PxG are arrayed in the +X direction. Similarly, the sub pixel PxR and the sub pixel PxB2 are arrayed in the +X direction. In addition, the sub pixel PxB1 and the sub pixel PxR are arrayed in the +Y direction. Similarly, the sub pixel PxG and the sub pixel PxB2 are arrayed in the +Y direction. The sub pixel PxB1 is connected to the sub pixel PxB2 located in the direction A as viewed from the sub pixel PxB1, at a reflection layer 52 (refer to FIG. 7). In one exemplary embodiment, it is assumed that light-emitting regions HaR, HaG, HaB1, and HaB2 for emitting light in the +Z direction are formed with the light-emitting elements 3R, 3G, 3B1, and 3B2 included in a pixel MPx, respectively. A light-emitting region Ha is opened by a pixel separation layer 34 (refer to FIG. 7) in the region of the pixel electrode 31 (refer to FIG. 7).

The shape of each of the light-emitting regions HaR, HaG, HaB1, and HaB2 as viewed in a plan view from the +Z direction is octagonal. Among the sides of the light-emitting region Ha, a first side located in the direction C as viewed from the center of the light-emitting region Ha is parallel with a fifth side located in the direction A as viewed from the center of the light-emitting region Ha. Further, among the sides of the light-emitting region Ha, a second side located in the −Y direction as viewed from the center of the light-emitting region Ha is parallel with a sixth side located in +Y direction as viewed from the center of the light-emitting region Ha. Further, among the sides of the light-emitting region Ha, a third side located in the direction D as viewed from the center of the light-emitting region Ha is parallel with a seventh side located in the direction B as viewed from the center of the light-emitting region Ha.

Furthermore, among the sides of the light-emitting region Ha, a fourth side located in +X direction as viewed from the center of the light-emitting region Ha is parallel with an eighth side located in the −X direction as viewed from the center of the light-emitting region Ha.

Further, the contact region Ca included in the sub pixel Px is located in the direction A as viewed from the light-emitting region Ha included in the sub pixel Px.

Specifically, the contact region CaR included in the sub pixel PxR is located in the direction A with respect to the light-emitting region HaR of the sub pixel PxR, and the contact region CaG included in the sub pixel PxG is located in the direction A with respect to the light-emitting region HaG of the sub pixel PxG. Similarly, the contact region CaB1 included in the sub pixel PxB1 is located in the direction A with respect to the light-emitting region HaB1 included in the sub pixel PxB1, and the contact region CaB2 included in the sub pixel PxB2 is located in the direction A with respect to the light-emitting region HaB2 included in the sub pixel PxB2.

Figure 4:
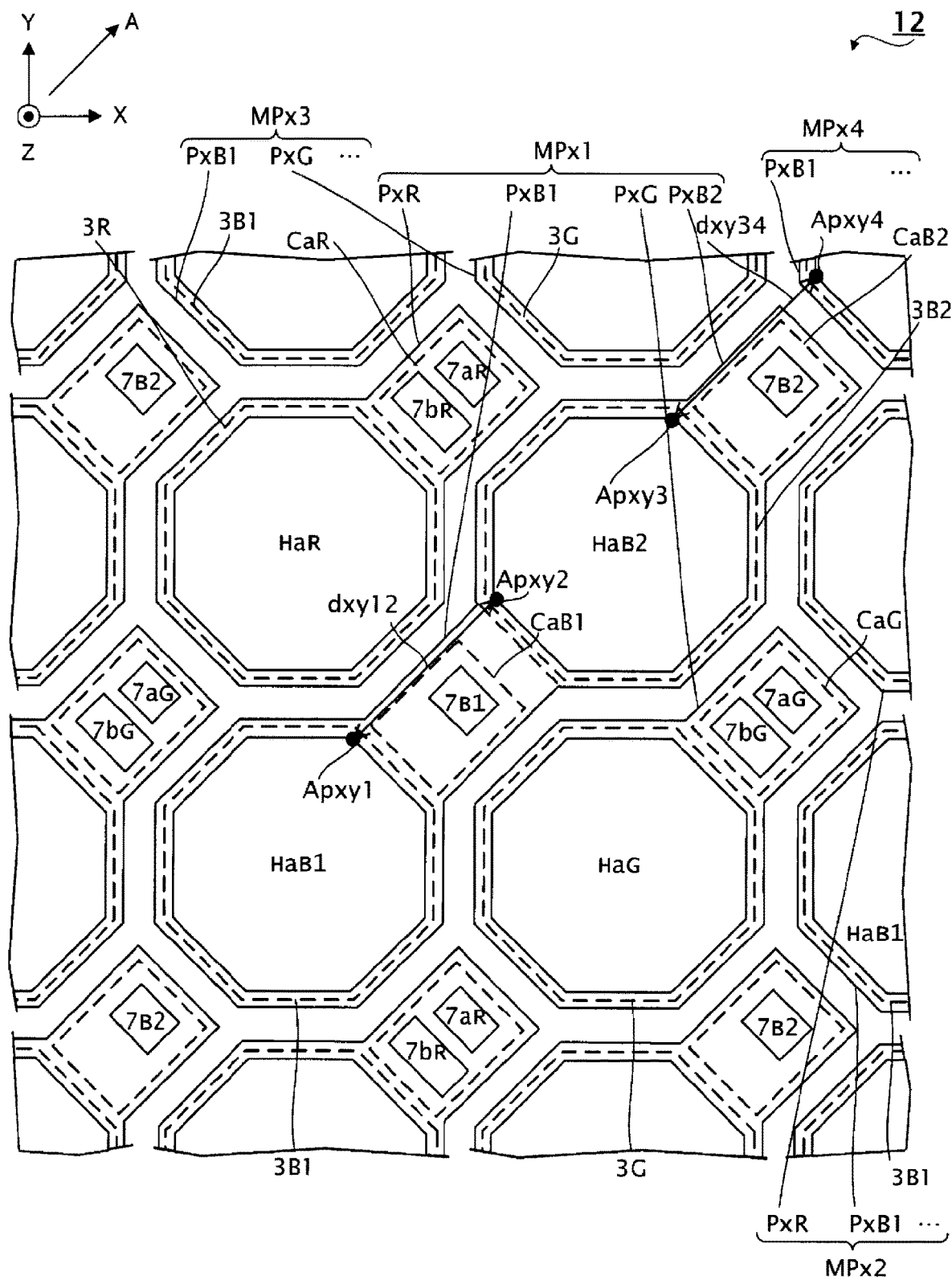
FIG. 4 is a plan view illustrating a second example of the structure of the display 12.

FIG. 4 is a plan view illustrating an example of a schematic structure of the display 12 when a part of the display 12 of some exemplary embodiments is viewed in a plan view from the +Z direction. Note that the plan view of FIG. 4 is illustrated excluding the color filter 81 to make the drawing more understandable. An inclined direction in FIG. 4 is assumed to be the direction A inclined at 45 degrees with respect to the +X direction and at −45 degrees with respect to the +Y direction.

The contact regions Ca are arrayed in the direction A. A contact 7B1 is disposed in the contact region CaB1, and a contact 7B2 is disposed in the contact region CaB2. The contact 7B1 and the contact 7B2 electrically connect the pixel electrode 31 to the reflective layer 52 (refer to FIG. 7) through a contact electrode 71 (refer to FIG. 7). On the other hand, a reflective layer-barrier metal contact 7aR for electrically connecting the reflective layer 52 to the contact electrode 71, and a barrier metal-positive electrode contact 7bR for electrically connecting the contact electrode 71 to the pixel electrode 31, are arrayed in the contact region CaR. Similarly, a reflective layer-barrier metal contact 7aG and a barrier metal-positive electrode contact 7bG are arrayed in the contact region CaG. Here, the reason why the two contacts 7 are each disposed in the contact region CaR and the contact region CaG, will be described. A first distance adjustment layer 57 (refer to FIG. 15) and a second distance adjustment layer 58 (refer to FIG. 15) are layered on the sub pixel PxR, and the second distance adjustment layer 58 is layered on the sub pixel PxG. Due to the presence of the distance adjustment layers as described above, a barrier metal-positive electrode contact 7b is formed in the contact region CaR and the contact region CaG, avoiding a reflective layer-barrier metal contact 7a, at another position.

Figure 5:
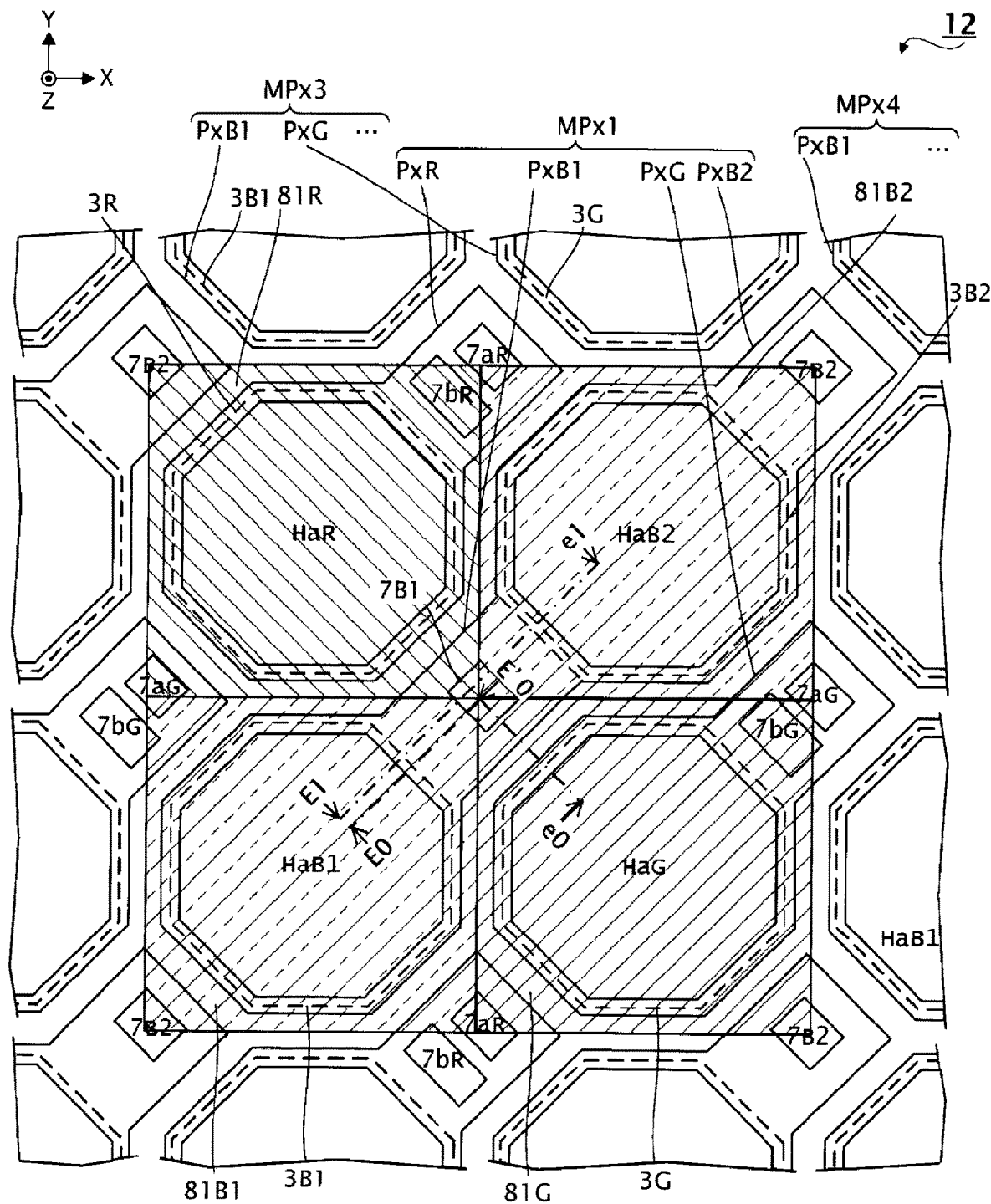
FIG. 5 is a plan view illustrating a third example of the structure of the display 12.

FIG. 5 is a plan view illustrating an example of a schematic structure of the display 12 when a part of the display 12 of some exemplary embodiments is viewed in a plan view from the +Z direction. The plan view of FIG. 5 is illustrated further including the color filter 81 in the plan view of FIGS. 3 and 4. Further, the plan view of FIG. 5 is illustrated excluding the contact region Ca to make the drawing more understandable.

The color filter 81R is formed to overlap with the sub pixel PxR in a plan view from the +Z direction on the +Z side of the light-emitting element 3R. Similarly, a color filter 81G is formed to overlap with the sub pixel PxG in a plan view from the +Z direction on the +Z side of the light-emitting element 3G. A color filter 81B1 is formed to overlap with the sub pixel PxB1 in a plan view from the +Z direction on the +Z side of the light-emitting element 3B1. A color filter 81B2 is formed to overlap with the sub pixel PxB2 in a plan view from the +Z direction on the +Z side of the light-emitting element 3B2. As depicted in FIG. 5, in one exemplary embodiment, the color filter 81 is formed in a rectangular shape in a plan view from the +Z direction. Further, as depicted in FIG. 5, in one exemplary embodiment, although the color filters 81 do not overlap with each other, parts of the color filters 81 may overlap with each other. In addition, with respect to the X-axis direction or the Y-axis direction, the distances between the end portions of the color filter 81 and the light-emitting region Ha located adjacent to the color filter 81 in one of the above directions are equal to each other.

Figure 6:
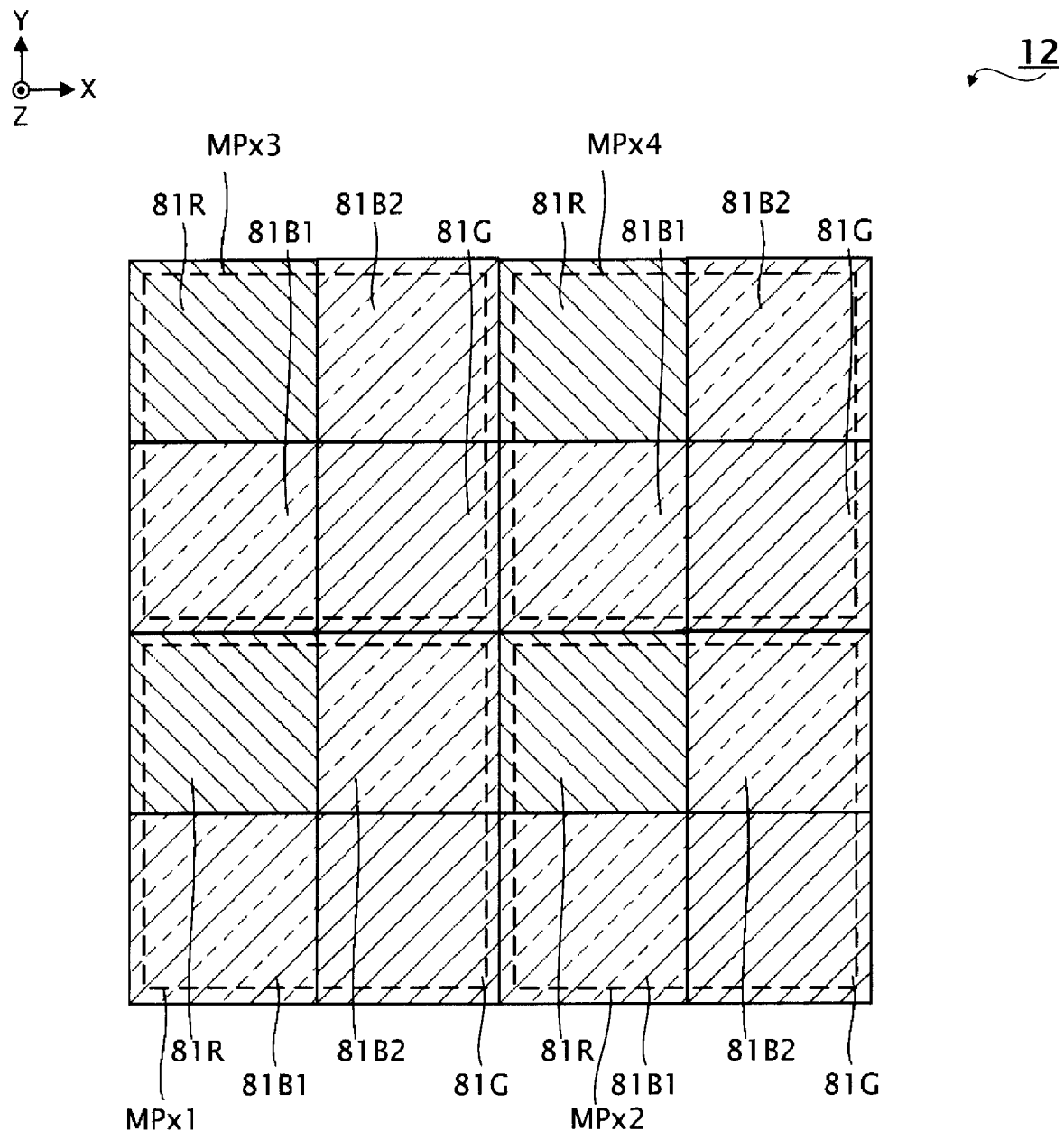
FIG. 6 is a plan view illustrating a fourth example of the structure of the display 12.

FIG. 6 is a plan view illustrating an example of a schematic structure of the display 12 when a part of the display 12 of some exemplary embodiments is viewed in a plan view from the +Z direction.

In the plan view of FIG. 6, the color filters 81 of the pixels MPx1 to MPx4 are specifically illustrated.

Figure 7:
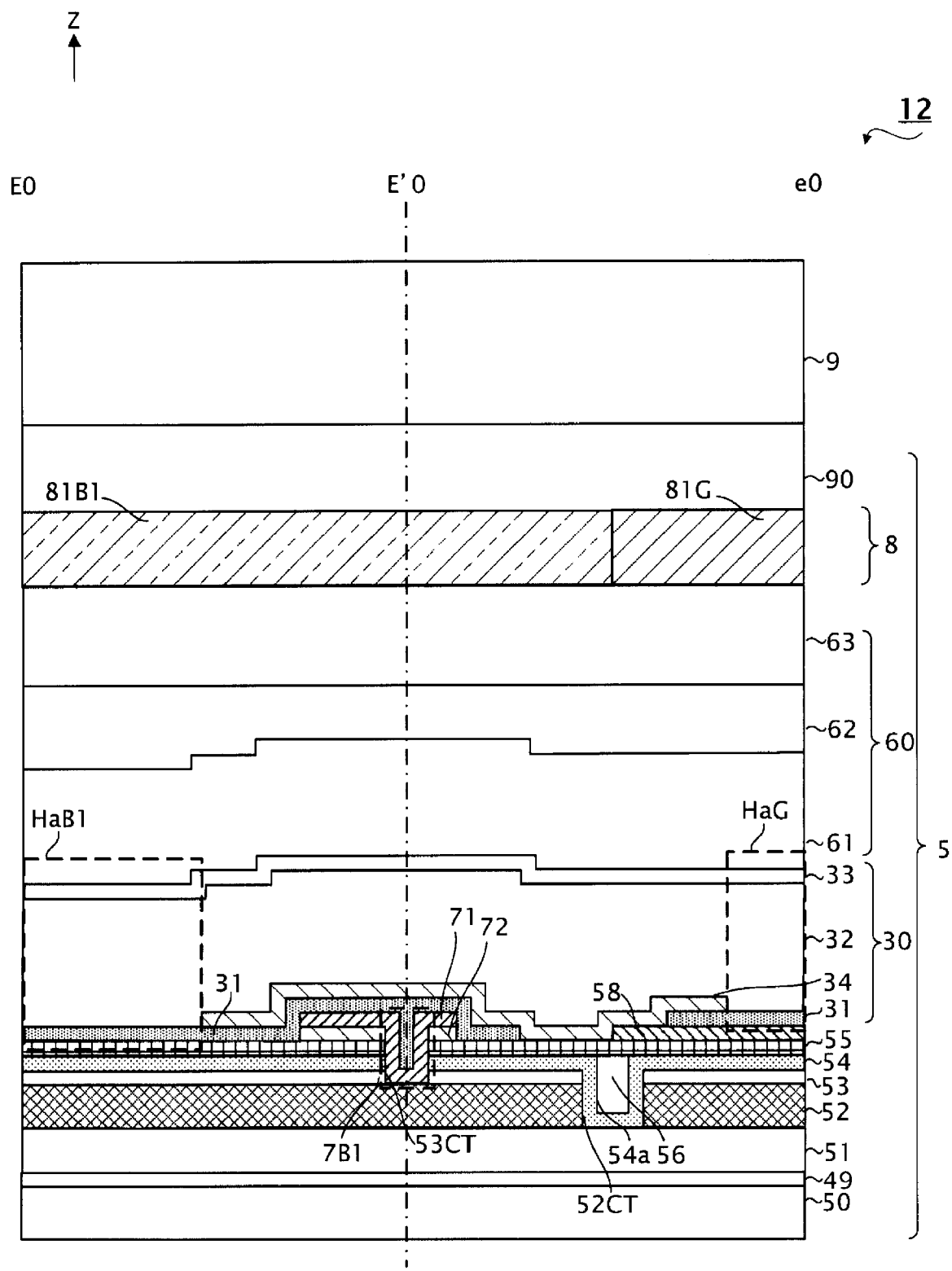
FIG. 7 is a partial cross-sectional view illustrating the first example of the structure of the display 12.

FIG. 7 is an example of a partial cross-sectional view of the display 12 taken along line E0-E'0-e0 in FIG. 5, in which a cross-sectional surface of the contact 7B1 is depicted.

As depicted in FIG. 7, the display 12 includes an element substrate 5, a protective substrate 9, and an adhesive layer 90 interposed between the element substrate 5 and the protective substrate 9. In one exemplary embodiment, it is assumed that the electro-optical device 1 is a top emission type in which light is emitted from a protective substrate 9 side (+Z side).

The adhesive layer 90 is a transparent resin layer for adhesion of the element substrate 5 to the protective substrate 9. The adhesive layer 90 is formed, for example, using a transparent resin material, such as epoxy resin. The protective substrate 9 is a transparent substrate disposed on the +Z side of the adhesive layer 90. The protective substrate 9 protects members, such as the color filter 81 disposed on the −Z side of the protective substrate 9. The protective substrate 9 is formed, for example, using a substrate, such as a quartz substrate.

The element substrate 5 includes a substrate 50, a circuit layer 49 on the substrate 50, an interlayer insulating layer 51 layered on the circuit layer 49, the reflective layer 52, a reflection-increasing layer 53, a first insulating layer 54, a second insulating layer 55, a contact electrode 71, a protective layer 72, a light-emitting layer 30, a sealing layer 60, and a color filter layer 8. Although details will be described later, the light emitting layer 30 includes the above-described light-emitting elements 3 (3R, 3G, and 3B). The light-emitting element 3 emits light in +Z direction and −Z direction. The color filter layer 8 includes the color filter 81R, the color filter 81G, and the color filter 81B that are described above.

The substrate 50 may be any substrate insofar as various wirings and various circuits are capable of being mounted on the substrate 50. Substrates, such as a silicon substrate, quartz substrate, glass substrate, and the like are used for the substrate 50. A circuit layer 49 is formed on the +Z side of the substrate 50. In the circuit layer 49, various wirings, such as the scanning line 13 and the data line 14, and various circuits, such as the driving circuit 11 and the pixel circuit 100 are formed. The interlayer insulating layer 51 is layered on the +Z side of the circuit layer 49.

An insulating material, such as silicon oxide ($SiO_2$) is used for the interlayer insulating layer 51. The reflective layer 52 is layered on the +Z side of the interlayer insulating layer 51. The reflective layer 52 is a component for reflecting the light emitted from the light-emitting element 3 of the light emitting layer 30 toward the side of the +Z direction. For the reflective layer 52, for example, an alloy (AlCu) film of aluminum (Al) and copper (Cu) is formed on a titanium (Ti) film. The reflective layer 52 is a conductive layer that is reflective and is formed in an island shape for each of the sub pixels Px.

The reflection-increasing layer 53 is provided for enhancing the reflective property of the reflection layer 52, and is formed of, for example, an insulating material having optical transparency. The reflection-increasing layer 53 is disposed to cover the surface of the reflection layer 52. A member, such as silicon oxide film is formed as the reflection-increasing layer 53.

The first insulating layer 54 is provided on the surface of the reflection-increasing layer 53. Here, the first insulating layer 54 is formed along a gap 52CT provided in the reflective layer 52. Thus, the first insulating layer 54 has a concave portion 54a corresponding to the gap 52CT. The embedded insulating film 56 is formed to fill up the concave portion 54a. The second insulating layer 55 is provided on the surface of the first insulating layer 54. A member, such as silicon nitride (SiN) film is formed as the first insulating layer 54 and the second insulating layer 55.

The contact electrode 71 is layered on the reflective layer 52 and the protective layer 72, and is formed along a gap 53CT. As depicted in FIG. 7, the contact electrode 71 extends along the gap 53CT to form the contact 7B1. A conductive material, such as tungsten (W), titanium (Ti), titanium nitride (TiN), and the like is used for the contact electrode 71. The protective layer 72 is layered on the second insulating layer 55. An insulating material, such as silicon oxide is used for the protective layer 72.

The first distance adjustment layer 57 and the second distance adjustment layer 58 are insulating transparent layers for adjusting the optical distance between the light-emitting element 3 of the light emitting layer 30 and the reflective layer 52 for each of the sub pixels PxR, PxG, and PxB. In one exemplary embodiment, a silicon oxide film is formed as the first distance adjustment layer 57 and the second distance adjustment layer 58. The first distance adjustment layer 57 and the second distance adjustment layer 58 are not layered on the sub pixel PxB. In addition, the second distance adjustment layer 58 is specifically layered on the sub pixel PxG, and the first distance adjustment layer 57 is not layered on the sub pixel PxG. Accordingly, the first distance adjustment layer 57 is not depicted in FIG. 7.

The light-emitting layer 30 includes the pixel electrode 31, the pixel separation layer 34, the light-emitting function layer 32 layered on the pixel electrode 31 and the pixel separation layer 34 to cover the pixel electrode 31 and the pixel separation layer 34, and the counter electrode 33 layered on the light-emitting function layer 32.

The pixel electrode 31 is a transparent layer that is conductive and is formed in an island-like shape for each of the sub pixels Px. The pixel electrode 31 is layered on the second insulating layer 55, the first distance adjustment layer 57, and the second distance adjustment layer 58. The pixel electrode 31 is formed using a conductive transparent material, such as Indium Tin Oxide (ITO). The counter electrode 33 is a conductive component having light transmittance and light reflectivity being arrayed across the plurality of sub pixels Px. The counter electrode 33 includes an alloy, such as a Mg alloy, Ag alloy, and the like. The pixel separation layer 34 is an insulating component disposed to cover the peripheral portion of each pixel electrode 31. The pixel separation layer 34 is layered on the second distance adjustment layer 58, the second insulating layer 55, and the pixel electrode 31. The pixel separation layer 34 includes an insulating material, such as silicon oxide. The light-emitting function layer 32 includes a hole injection layer, a hole transport layer, an organic light-emitting layer, and an electron transport layer, being disposed across the plurality of sub pixels Px.

As described above, holes are supplied to the light-emitting function layer 32 from a portion of the pixel electrode 31 which is not covered with the pixel separation layer 34, and the light-emitting function layer 32 emits white light. In addition, the pixel separation layer 34 is disposed, in a plan view, to partition the plurality of pixels Px of the display 12 from one another. Note that the white light emitted from the light-emitting element 3 includes red light, green light, and blue light. Also note that in one exemplary embodiment, a structure included in a region including the light-emitting region Ha and the contact region Ca in a plan view from the +Z direction, is taken as the sub pixel Px.

In one exemplary embodiment, film thicknesses of the first distance adjustment layer 57 and the second distance adjustment layer 58 are adjusted, and an optical resonance structure is formed with the reflective layer 52 and the counter electrode 33. Furthermore, the light emitted from the light-emitting function layer 32 is repeatedly reflected between the reflective layer 52 and the counter electrode 33, and intensity of light with a wavelength corresponding to the optical distance between the reflective layer 52 and the counter electrode 33 is enhanced. The intensified light is transmitted from the counter electrode 33 to the protective substrate 9, and is thereafter emitted toward the +Z side. In one exemplary embodiment, for example, the film thicknesses of the first distance adjustment layer 57 and the second distance adjustment layer 58 are set for each of the sub pixels Px such that the intensity of light with a wavelength of 610 nm is intensified in the sub pixel PxR, the intensity of light with a wavelength of 540 nm is intensified in the sub pixel PxG, and the intensity of light with a wavelength of 470 nm is intensified in the sub pixel PxB. Accordingly, in one exemplary embodiment, red light having the maximum luminance at a wavelength of 610 nm is emitted from the sub pixel PxR, green light having the maximum luminance at a wavelength of 540 nm is emitted from the sub pixel PxG, and blue light having the maximum luminance at a wavelength of 470 nm is emitted from the sub pixel PxB.

The sealing layer 60 includes a lower sealing layer 61 layered on the counter electrode 33, a planarizing layer 62 layered on the lower sealing layer 61, and an upper sealing layer 63 layered on the planarizing layer 62. The lower sealing layer 61 and the upper sealing layer 63 are arrayed across the plurality of sub pixels Px and are transparent layers having insulating properties. The lower sealing layer 61 and the upper sealing layer 63 are components for preventing intrusion of moisture, oxygen and the like into the light emitting layer 30. A member, such as silicon oxynitride (SiON) film is formed as the lower sealing layer 61 and the upper sealing layer 63. The planarizing layer 62 is a transparent layer disposed across the plurality of sub pixels Px, and is a component for providing a flat upper surface (a surface on the +Z side). The planarizing layer 62 is formed, for example, using an inorganic material, such as epoxy resin.

The color filter layer 8 includes color filters 81R, 81G, 81B1, and 81B2. The color filters 81R, 81G, 81B1, and 81B2 are formed on the upper sealing layer 63. A photo-sensitive resin containing a pigment that allows light transmission of various colors, for example, of red, green and blue, is applied, and then patterning is performed to form the color filters 81R, 81G, 81B1, and 81B2.

Figure 8:
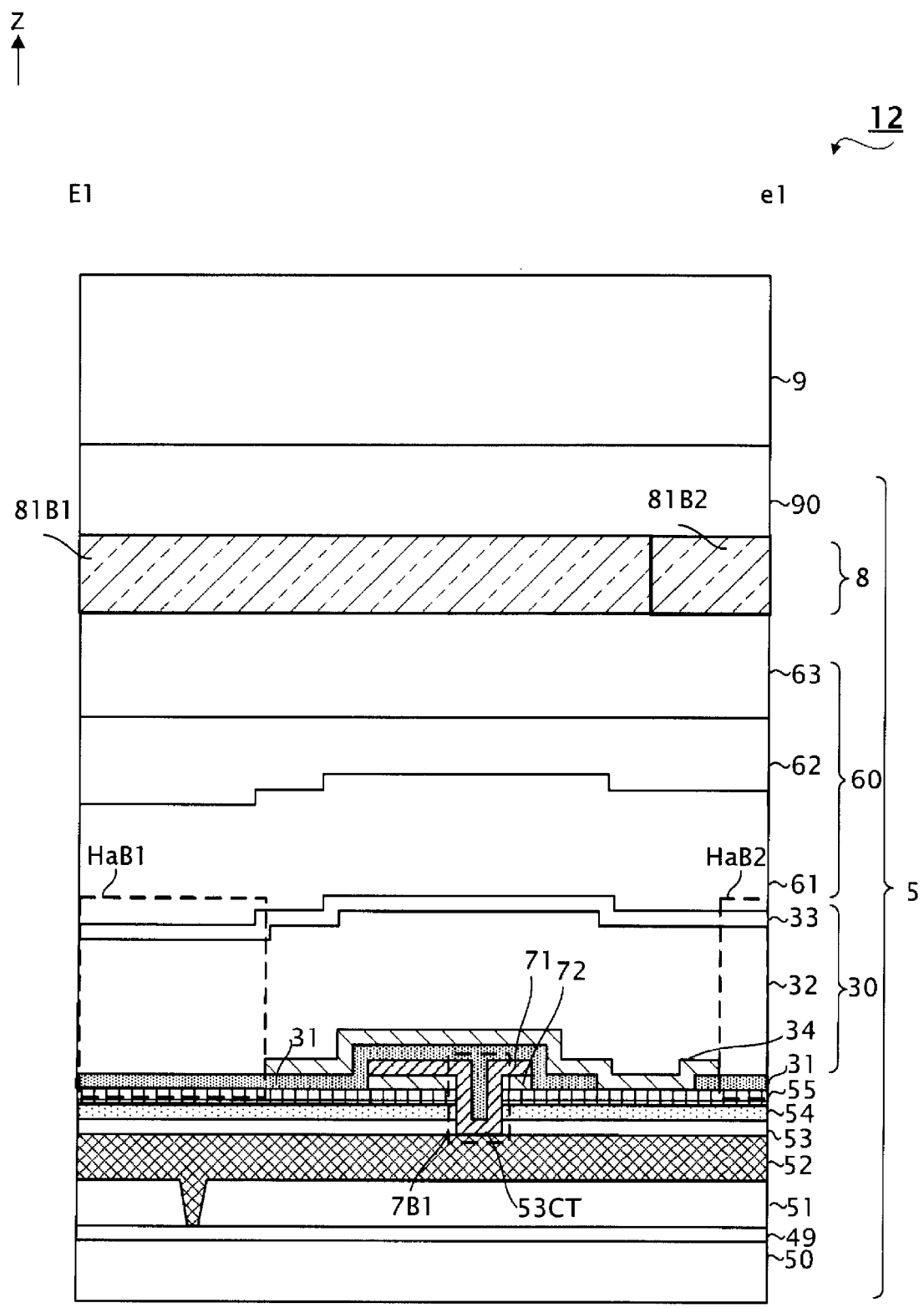
FIG. 8 is a partial cross-sectional view illustrating the second example of the structure of the display 12.

FIG. 8 is an example of a partial cross-sectional view of the display unit 12 taken along line E1-e1 in FIG. 5, in which the cross-sectional surface of the contact 7B1 is depicted. In FIG. 8, the descriptions of the portions that have been described with reference to the FIG. 7 are omitted.

A gap 52CT is depicted in FIG. 7, however, the sub pixels PxB1 is connected to the sub pixel PxB2 in the reflective layer 52, and the gap 52CT is not depicted at the portion slashed by the line E1-e1 in FIG. 5. Accordingly, the gap 52CT is not depicted in FIG. 8, and the sub pixel PxB is not depicted in FIG. 8 because the first distance adjustment layer 57 and the second distance adjustment layer 58 are not layered on the sub pixel PxB.

Effects of Some Exemplary Embodiments

As depicted in FIG. 3, the contact region Ca overlaps with, in a plan view from the +Z direction, an intersection point of a boundary line that partitions the light-emitting region Ha. The boundary line is provided for evenly partitioning the light-emitting region Ha. FIG. 3 illustrates boundary lines HL1 and HL2 in the X-axis direction, and boundary lines VL1 and VL2 in the Y-axis direction. As depicted in FIG. 3, the contact region CaB1 included in the pixel MPx1 overlaps with an intersection point P11 of the boundary lines VL1 and HL1, and the contact region CaG included in the pixel MPx1 overlaps with an intersection point P21 of the boundary lines VL2 and HL1. Similarly, the contact region CaR included in the pixel MPx1 overlaps with an intersection point P12 of the boundary lines VL1 and HL2, and the contact region CaB2 included in the pixel MPx1 overlaps with an intersection point P22 of the boundary lines VL2 and HL2 as well. For example, the intersection point P11 is located apart from the centers of the light-emitting regions HaR, HaG, HaB1, and HaB2, and thus a reduction in sizes of the light-emitting regions HaR, HaG, HaB1, and HaB2 is suppressed. Furthermore, the contact region Ca is disposed to overlap with the intersection point of the boundary lines that partition the light-emitting region Ha, and thus the contact region Ca is disposed on a partial area of the adjacent another sub pixel Px. Further, the contact region Ca of one sub pixel Px is disposed on a partial area of the one sub pixel Px and a partial area of another adjacent sub pixel Px, and the contact region Ca is disposed across the boundary line. Accordingly, the contact regions Ca are arrayed at equal intervals between the sub pixels, and thus the intervals between the light-emitting regions are made equal as well. In one exemplary embodiment, as depicted in FIG. 3, the light-emitting region Ha has an octagonal shape formed by apexes of a quadrangle being cut. As depicted in FIG. 3, the contact region Ca is disposed on the cut part. As depicted in FIG. 3, the contact regions Ca are arrayed at equal intervals between the sub pixels Px, and thus the intervals between the light-emitting regions Ha are made equal as well. The intervals between the light-emitting regions Ha are equalized and thus a variation in color change depending on the viewing angle is suppressed. In this manner, the variation in color change depending on the viewing angle is suppressed while the reduction in size of the light-emitting region Ha is suppressed. The variation in color change depending on the viewing angle is suppressed and thus a deterioration in quality of the displayed images is suppressed.

Note that herein, the viewing angle is the maximum value of the angle formed by the Z-axis direction and the traveling direction of the light emitted from the light-emitting region Ha included in the sub pixel Px, with the light passing through the color filter 81 and the protective substrate 9 included in the sub pixel Px. Hereafter, the light direction described above in a plan view from the +Z direction may be referred to as a viewing angle in the direction described above. For example, when the above-described light is included in an X-Z plane, in a plan view from the +Z direction, the light direction coincides with the X-axis direction and thus the viewing angle may be referred to as a "viewing angle in the X-axis direction". Similarly, in a case where the above-described light is included in a Y-Z plane, in a plan view from +Z direction, the above-described light direction coincides with the Y-axis direction and thus the viewing angle may be referred to as a "viewing angle in the Y-axis direction".

According to the viewing angle in the X-direction, as depicted in FIG. 3, a distance dx12 between the light-emitting region HaB1 and the light-emitting region HaG in the pixel MPx1 is substantially equal to a distance dx34 between the light-emitting region HaG of the pixel MPx1 and the light-emitting region HaB1 of the pixel MPx2 located adjacent to the pixel MPx1 in +X direction. Note that herein, the distance dx12 is assumed to be substantially equal to the distance dx34, for example, when a difference value between the distance dx12 and the distance dx34 is equal to or less than a predetermined threshold value. The predetermined threshold value is, for example, as much as 10% of the width of the light-emitting region Ha. The distance dx12 is, as depicted in FIG. 3, the minimum distance between an apex Apx1 located in +X direction in the light-emitting region HaB1 of the pixel MPx1, and an apex Apx2 located in the −X direction in the light-emitting region HaG of the pixel MPx1. Similarly, the distance dx34 is the minimum distance between an apex Apx3 located in +X direction in the light-emitting region HaG of the pixel MPx1 and an apex Apx4 located in the −X direction in the light-emitting region HaB1 of the pixel MPx2. Note that the distance between the light-emitting regions Ha is not limited to the minimum distance from the apex of the light-emitting region and may be the minimum distance between the centers of the light-emitting regions Ha. Similarly, a distance dx56 between the light-emitting region HaR and the light-emitting region HaB2 of the pixel MPx1 is substantially equal to a distance dx78 between the light-emitting region HaB2 of the pixel MPx1 and the light-emitting region HaR of the pixel MPx2. In other words, the distances between the light-emitting regions Ha in the X-axis direction are constant values. The distance dx12 is substantially equal to the distance dx34, and thus the angle formed by the straight line that connects the end portion located in the X direction in the color filter 81G of the light-emitting element 3G of the pixel MPx1 and the apex Apx1, and the X-axis direction, is substantially equal to the angle formed by the straight line that connects the end portion located in the −X direction in the color filter 81B of the light-emitting element 3B1 of the pixel MPx2 and the apex Apx3, and the X-axis direction. A relationship between the distance dx56 and the distance dx78 is identical to the relationship between the distance dx12 and the distance dx34. Accordingly, in a case when the viewing angle is substantially equal to the above-described two angles, both the color change of the light emitted from the light-emitting region HaB1 of the pixel MPx1 and the color change of the light emitted from the light-emitting region HaG of the pixel MPx1 occur. As described above, the angles at which color changes occur in the light-emitting regions Ha located adjacent to each other in the X-axis direction are substantially equal to each other, and thus the variation in color change depending on the viewing angle in the X-axis direction, the variation being caused by the variation in distance between the light-emitting regions Ha arrayed in the X-axis direction, is suppressed.

According to the viewing angle in the Y-direction, as depicted in FIG. 3, a distance dy12 between the light-emitting region HaB1 and the light-emitting region HaR in the pixel MPx1 is substantially equal to a distance dy34 between the light-emitting region HaR of the pixel MPx1 and the light-emitting region HaB1 of the pixel MPx3 located adjacent to the pixel MPx1 in the +Y direction. Note that herein, the distance dy12 is assumed to be substantially equal to the distance dy34 when, for example, the difference value between the distance dy12 and the distance dy34 is equal to or less than a predetermined threshold value. The predetermined threshold value is, for example, as much as 10% of the height of the light-emitting region Ha. The distance dy12 is, as depicted in FIG. 3, the minimum distance between an apex Apy1 located in the +Y direction in the light-emitting region HaB1 of the pixel MPx1, and an apex Apy2 located in the −Y direction in the light-emitting region HaR of the pixel MPx1. Similarly, the distance dy34 is the minimum distance between an apex Apy3 located in the +Y direction in the light-emitting region HaR of the pixel MPx1 and an apex Apy4 located in the −Y direction in the light-emitting region HaB1 of the pixel MPx3. Similarly, a distance dy56 between the light-emitting region HaG and the light-emitting region HaB2 in the pixel MPx1 is substantially equal to a distance dy78 between the light-emitting region HaB2 of the pixel MPx1 and the light-emitting region HaG of the pixel MPx3. In other words, the distances between the light-emitting regions Ha in the Y-axis direction are constant values. The distance dy12 is substantially equal to the distance dy34 and the distance dy56 is substantially equal to the distance dy78, and thus in a similar manner as in the X-direction, the variation in color change depending on the viewing angle in the Y-axis direction, the variation being caused by to the variation in distance between the light-emitting regions Ha arrayed in the Y-axis direction, is suppressed.

Further, according to the viewing angle in the X-axis direction, as depicted in FIG. 6, the relationship between the color of the one sub pixel Px and the color of the sub pixel located adjacent to the above-described one sub pixel in the +X direction, is uniquely determined in accordance with the color of the above-described one sub pixel. Specifically, the color filter 81 located adjacent to each of the sub pixels PxR of the pixels MPx1 to MPx4 in the +X direction is the color filter 81B. Similarly, the color filter 81 located adjacent to each of the sub pixels PxG of the pixels MPx1 to MPx4 in the +X direction is the color filter 81B. The color filter 81 located adjacent to the sub pixel PxB of each of the pixels MPx1 to MPx4 in the +X direction is the color filter 81R or 81G. Furthermore, the ratio in which the color filters 81R are located adjacent to each other is equal to the ratio in which the color filters 81G are located adjacent to each other. Accordingly, a uniquely determined color change occurs in the sub pixel Px of identical color when a color change occurs at one viewing angle in the +X direction, and thus the variation in color change depending on the viewing angle caused by the color variation of the color filter 81 located in the +X direction is suppressed. The description above in the +X direction is identical to a description in the −X direction.

In addition, according to the color change depending on the viewing angle in the Y-axis direction, as depicted in FIG. 6, the relationship between the color of the one sub pixel Px and the color of the sub pixel located adjacent to the above-described one sub pixel in the +Y direction, is uniquely determined in accordance with the color of the above-described one sub pixel. Specifically, the color filter 81 located adjacent to each of the sub pixels PxR of the pixels MPx1 to MPx4 in the +Y direction is the color filter 81B. Similarly, the color filter 81 located adjacent to each of the sub pixels PxG of the pixels MPx1 to MPx4 in the +Y direction is the color filter 81B. The color filter 81 located adjacent to each of the sub pixels PxB of the pixels MPx1 to MPx4 in the +Y direction is the color filter 81R or 81G. Furthermore, the ratio in which the color filters 81R are located adjacent to each other is equal to the ratio in which the color filters 81G are located adjacent to each other. Accordingly, a uniquely determined color change occurs in the sub pixel Px of identical color when a color change occurs at one viewing angle in the +Y direction, and thus the variation in color change depending on the viewing angle caused by the color variation of the color filter 81 located in the +Y direction is suppressed. The description above in the +Y direction is identical to a description in the −Y direction.

Furthermore, according to the relationship between the color change depending on the viewing angle in the X-axis direction and the color change depending on the viewing angle in the Y-axis direction, the color filter 81 located adjacent to the sub pixels PxR and PxG in the X-axis direction and the Y-axis direction with respect to the sub pixels PxR and PxG is the color filter 81B. In addition, the color filter 81 located adjacent to the sub pixel PxB in the X-axis direction and the Y-axis direction with respect to the sub pixel PxB is the color filter 81R or 81G. As described above, in one exemplary embodiment, the disposal of adjacent colors in the X-axis direction is identical to the disposal of adjacent colors in the Y-axis direction, and thus the color change depending on the viewing angle in the X-axis direction is made identical to the color change depending on the viewing angle in the Y-axis direction.

Similarly, according to the color change depending on the direction A, the direction B, the direction C, and the direction D, the relationship between the color of the one sub pixel Px and the color of the sub pixel located adjacent to the above-described one sub pixel in the +Y direction is uniquely determined in accordance with the color of the above-described one sub pixel. Accordingly, the variation in color change related to the color filters 81 located adjacent to each other in any of the direction A, the direction B, the direction C, and the direction D with respect to the light-emitting region Ha is suppressed.

Further, as depicted in FIG. 4, the contact regions Ca are arrayed in the direction A that is inclined at 45 degrees with respect to the +X direction and is inclined at −45 degrees with respect to the +Y direction. Furthermore, the two contacts 7 are disposed within the contact regions CaR and CaG, and the two contacts 7 are concentrated at one location, thus the distance between the two contacts 7 is shortened and wiring is able to be smoothly performed. Further, the two contacts 7 are concentrated at one location, thus the contact region Ca is narrowed, and the light-emitting region Ha is widened.

Further, according to the viewing angle in the direction A, as depicted in FIG. 4, the distances between the light-emitting regions Ha of the sub pixels Px and the light-emitting regions Ha of the sub pixels Px disposed in the direction A with respect to the above-described sub pixels Px, are constant values. For example, the sub pixel PxB2 of the pixel MPx1 is disposed in the direction A with respect to the sub pixel PxB1 of the pixel MPx1. In addition, the sub pixel PxB1 of the pixel MPx4 is disposed in the direction A with respect to the sub pixel PxB2 of the pixel MPx1. The pixel MPx4 is disposed adjacent to the pixel MPx1 in the direction A. According to the distances being constant values, the distance dxy12 between the light-emitting region HaB1 of the pixel MPx1 and the light-emitting region HaB2 of the pixel MPx1 is substantially equal to the distance dxy34 between the light-emitting region HaB2 of the pixel MPx1 and the light-emitting region HaB1 of the pixel MPx4. The distance dx12, as depicted in FIG. 4, is the minimum distance between the apex Apxy1 located in the direction A in the light-emitting region HaB1 of the pixel MPx1 and the apex Apxy2 located in the direction C in the light-emitting region HaB2 of the pixel MPx1. Similarly, the distance dx34, as depicted in FIG. 4, is the minimum distance between the apex Apxy3 in the direction A in the light-emitting region HaB2 of the pixel MPx1 and the apex Apxy4 in the direction C in the light-emitting region HaB1 of the pixel MPx4. The distance dxy12 is substantially equal to the distance dxy34, and thus in a similar manner as in the X-axis direction and the Y-axis direction, the variation in color change depending on the viewing angle caused by the variation in the distances between the light-emitting regions Ha arrayed in the direction A and the direction C is suppressed.

In one exemplary embodiment, the +X direction is an example of a "first direction", and the +Y direction is an example of a "second direction". In addition, the sub pixel PxB1 is an example of a "first sub pixel", the sub pixel PxG is an example of a "second sub pixel", the sub pixel PxR is an example of a "fourth sub pixel", and the sub pixel PxB2 is an example of the "third sub pixel".

In one exemplary embodiment, an angle of 45 degrees is an example of a "first angle", an angle of −45 degrees is an example of a "second angle", and the direction A is an example of a "third direction". Further, the contact electrode is an example of an "intermediate electrode", and the reflective layer 52 is an example of a "reflective electrode". Furthermore, the reflective layer-barrier metal contact 7*a* is an example of a "first contact", and the barrier metal-positive electrode contact 7*b* is an example of a "second contact".

MODIFIED EXAMPLES

Each of the above exemplary embodiments may be variously modified. Specific modes of modification are exemplified below. Two or more exemplary embodiments freely selected from the following examples may be appropriately combined within a range that is not mutually contradictory. Note that in the modified examples exemplified below, the elements referenced in the above descriptions are appropriately omitted for the elements of which operations and functions are equivalent to the operations and functions of the elements in the exemplary embodiments.

MODIFIED EXAMPLE 1

Figure 9:
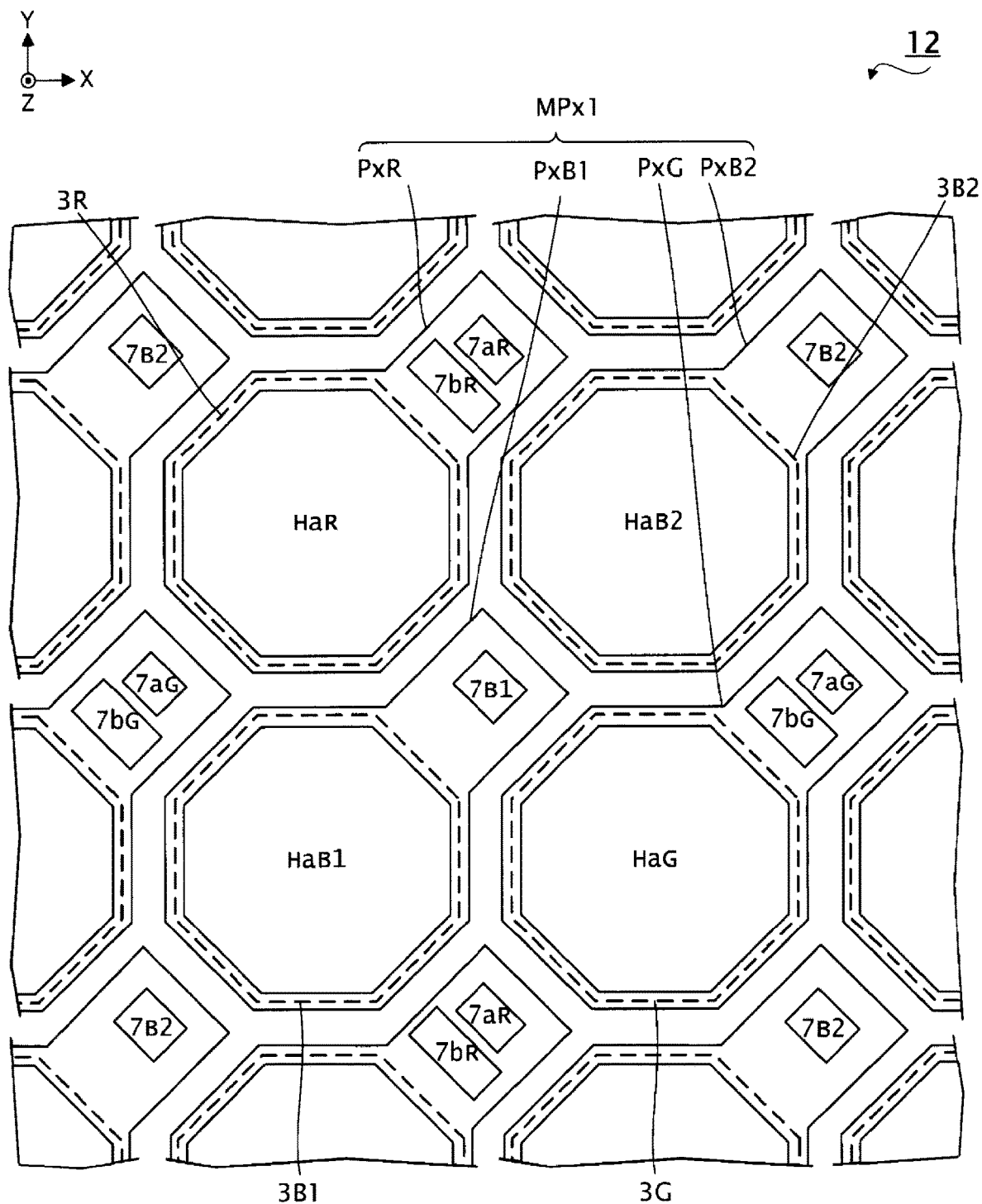
FIG. 9 is a plan view illustrating the first example of the structure of the display 12 in Modified Example 1.

FIG. 9 is a plan view illustrating an example of a schematic structure of the display 12 when a part of the display 12 in Modified Example 1 is viewed in a plan view from the +Z direction. Note that the plan view of FIG. 9 is illustrated excluding the color filter 81 and the contact region Ca to make the drawing more understandable. Also note that in Modified Example 1, a structure included in a region including the light-emitting region Ha and the contact region Ca in a plan view from the +Z direction is taken as the sub pixel Px.

In one exemplary embodiment, the sub pixel PxB1 is connected to sub pixel PxB2 in the reflective layer 52. Whereas in Modified Example 1, the sub pixel PxB1 is not connected to the sub pixel PxB2, and is separated from the sub pixel PxB2. The sub pixel PxB that is one of the separated sub pixels is to be connected to the pixel circuit 100 of the other sub pixel PxB in the circuit layer 49 to drive the sub pixels PxR, PxG, PxB1, and PxB2 of Modified Example 1 using a three pixel circuit.

Figure 10:
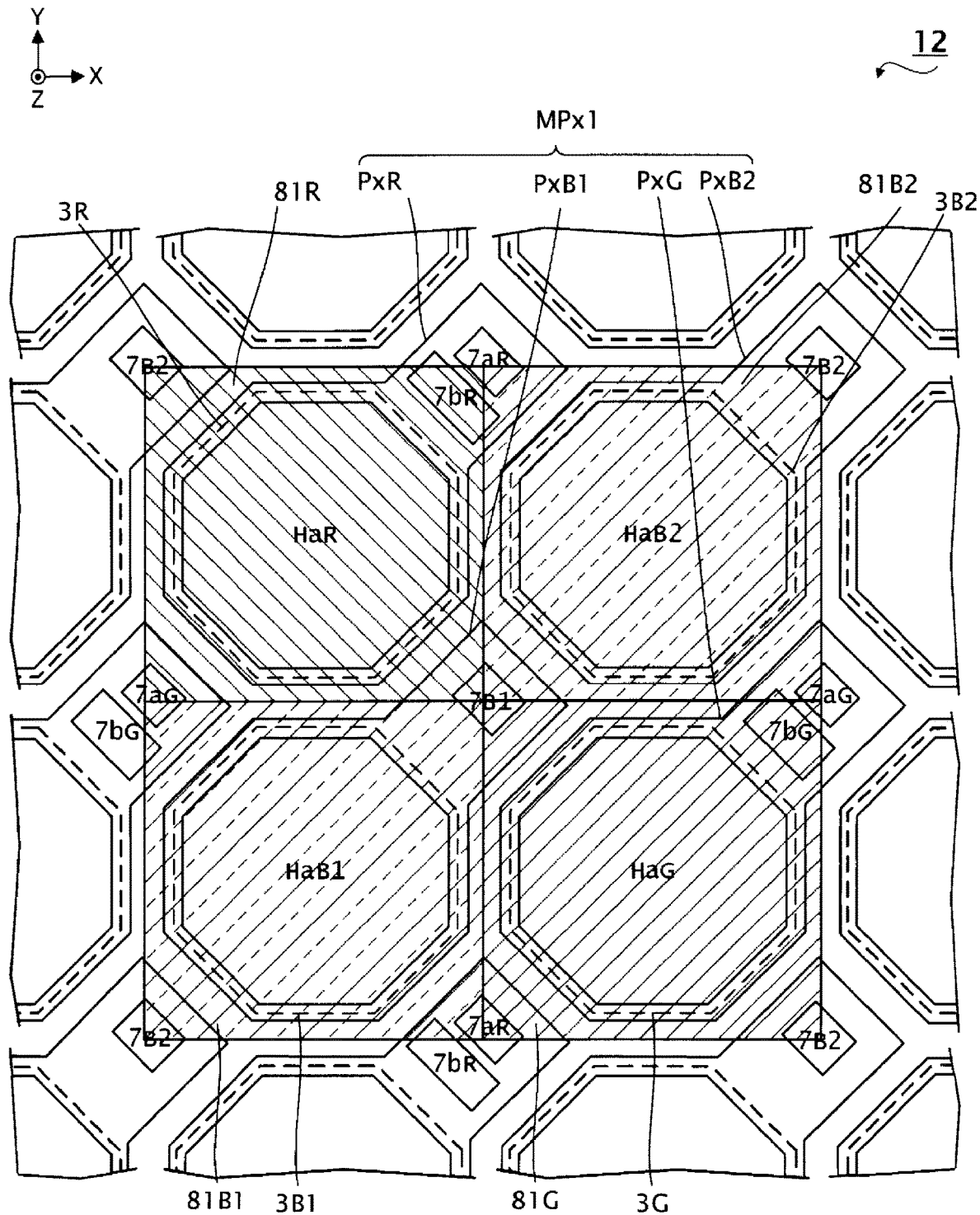
FIG. 10 is a plan view illustrating the second example of the structure of the display 12 in Modified Example 1.

FIG. 10 is a plan view illustrating an example of a schematic structure of the display 12 when a part of the display 12 in Modified Example 1 is viewed in a plan view from the +Z direction. The plan view of FIG. 10 is a plan view of FIG. 9 in which the color filter 81 is further included. Note that the plan view of FIG. 10 is illustrated excluding the contact region Ca to make the drawing more understandable.

As depicted in FIG. 10, the disposed location of the color filter 81 in Modified Example 1 is identical to the disposed location of the color filter 81 in one exemplary embodiment. Accordingly, color change features depending on the viewing angle in the X-axis direction and color change features depending on the viewing angle in the Y-axis direction are identical to features in one exemplary embodiment.

SECOND MODIFIED EXAMPLE

Figure 11:
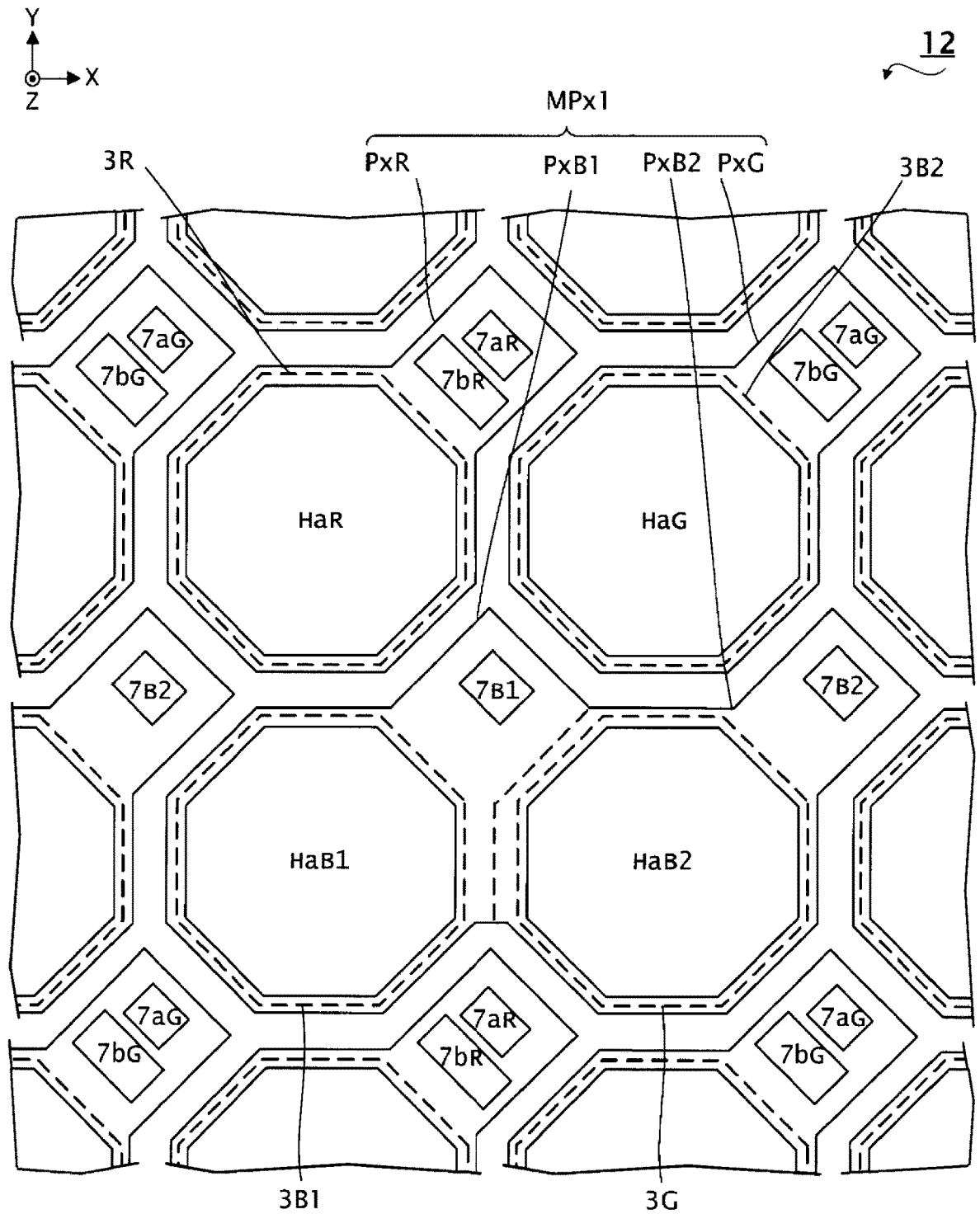
FIG. 11 is a plan view illustrating the first example of the structure of the display 12 in Modified Example 2.

FIG. 11 is a plan view illustrating an example of a schematic structure of the display 12 when a part of the display 12 in Modified Example 2 is viewed in a plan view from the +Z direction. Note that the plan view of FIG. 11 is illustrated excluding the color filter 81 and the contact region Ca to make the drawing more understandable.

Note that in Modified Example 2, a structure included in a region including the light-emitting region Ha and the contact region Ca in a plan view from the +Z direction is taken as the sub pixel Px.

In Modified Example 2, the sub pixel PxB1 and the sub pixel PxB2 are arrayed in the +X direction. Similarly, the sub pixel PxR and the sub pixel PxG are arrayed in the +X direction. In addition, the sub pixel PxB1 and the sub pixel PxR are arrayed in the +Y direction. Similarly, the sub pixel PxB2 and the sub pixel PxG are arrayed in the +Y direction. The sub pixel PxB1 is connected to the sub pixel PxB2 located in the +X direction as viewed from the sub pixel PxB1 in the reflective layer 52. As described above, the sub pixels Px in Modified Example 2 are disposed such that the sub pixel PxB2 and the sub pixel PxG are interchanged with each other from the disposal of the sub pixels Px in one exemplary embodiment.

In Modified Example 2, the sub pixel PxB1 is an example of the "first sub pixel", and the sub pixel PxB2 is an example of the "second sub pixel". In addition, the sub pixel PxR is an example of the "fourth sub pixel", and the sub pixel PxG is an example of the "third sub pixel".

Figure 12:
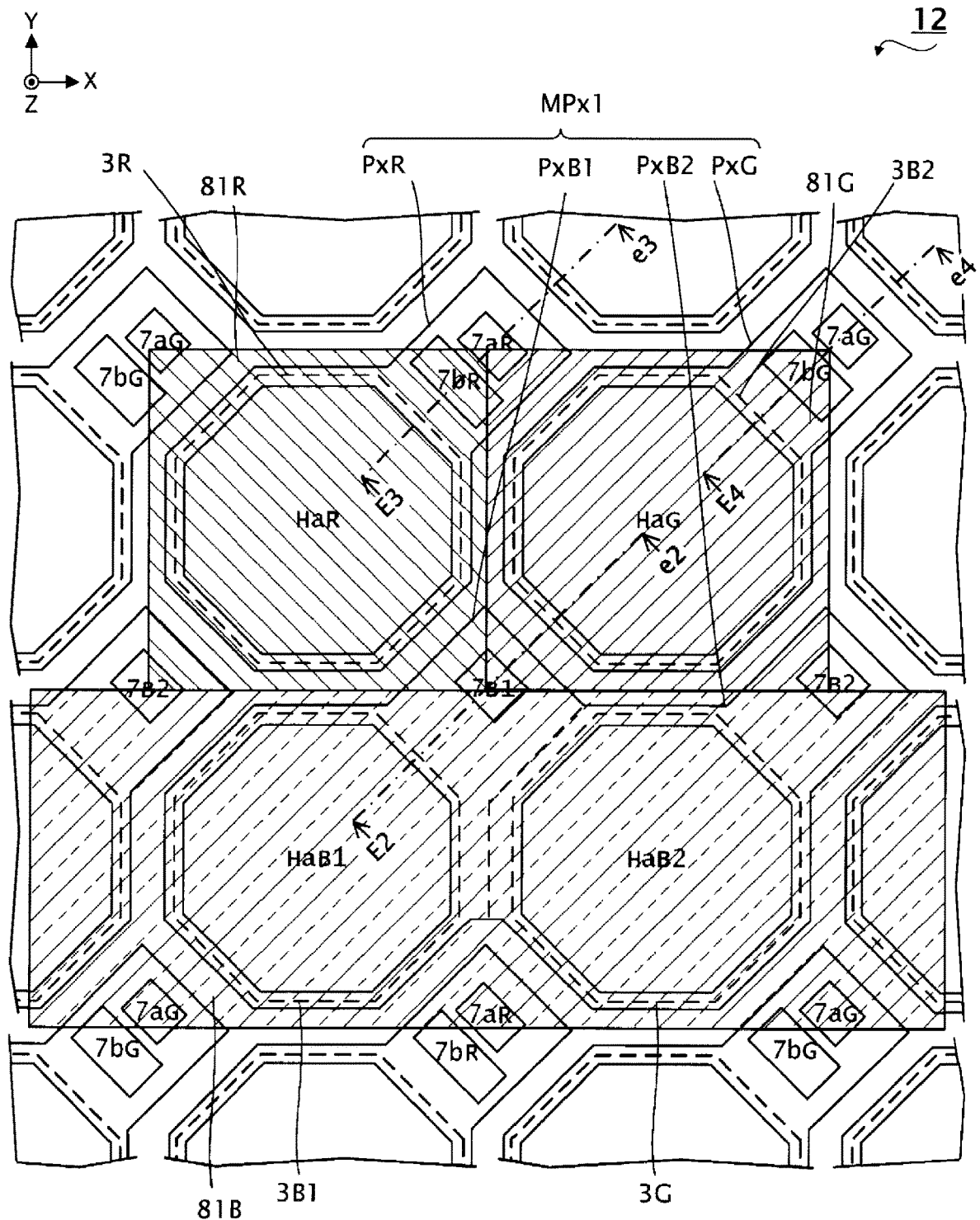
FIG. 12 is a plan view illustrating the second example of the structure of the display 12 in Modified Example 2.

FIG. 12 is a plan view illustrating an example of a schematic structure of the display 12 when a part of the display 12 in Modified Example 2 is viewed in a plan view from the +Z direction. The plan view of FIG. 12 is illustrated further including the color filter 81 in the plan view of FIG. 11. Note that the plan view of FIG. 12 is illustrated excluding the contact region Ca to make the drawing more understandable.

The color filter 81R is formed to overlap with the sub pixel PxR on the +Z side of the light-emitting region HaR in a plan view from the +Z direction. Similarly, the color filter 81G is formed to overlap with the sub pixel PxG on the +Z side of the light-emitting region HaG in a plan view from the +Z direction. The color filter 81B is formed to overlap with the sub pixels PxB1 and PxB2 on the +Z side of the light-emitting regions HaB1 and HaB2 in a plan view from the +Z direction. The color filter 81B is a common color filter for the sub pixels PxB arrayed in the X-axis direction.

Figure 13:
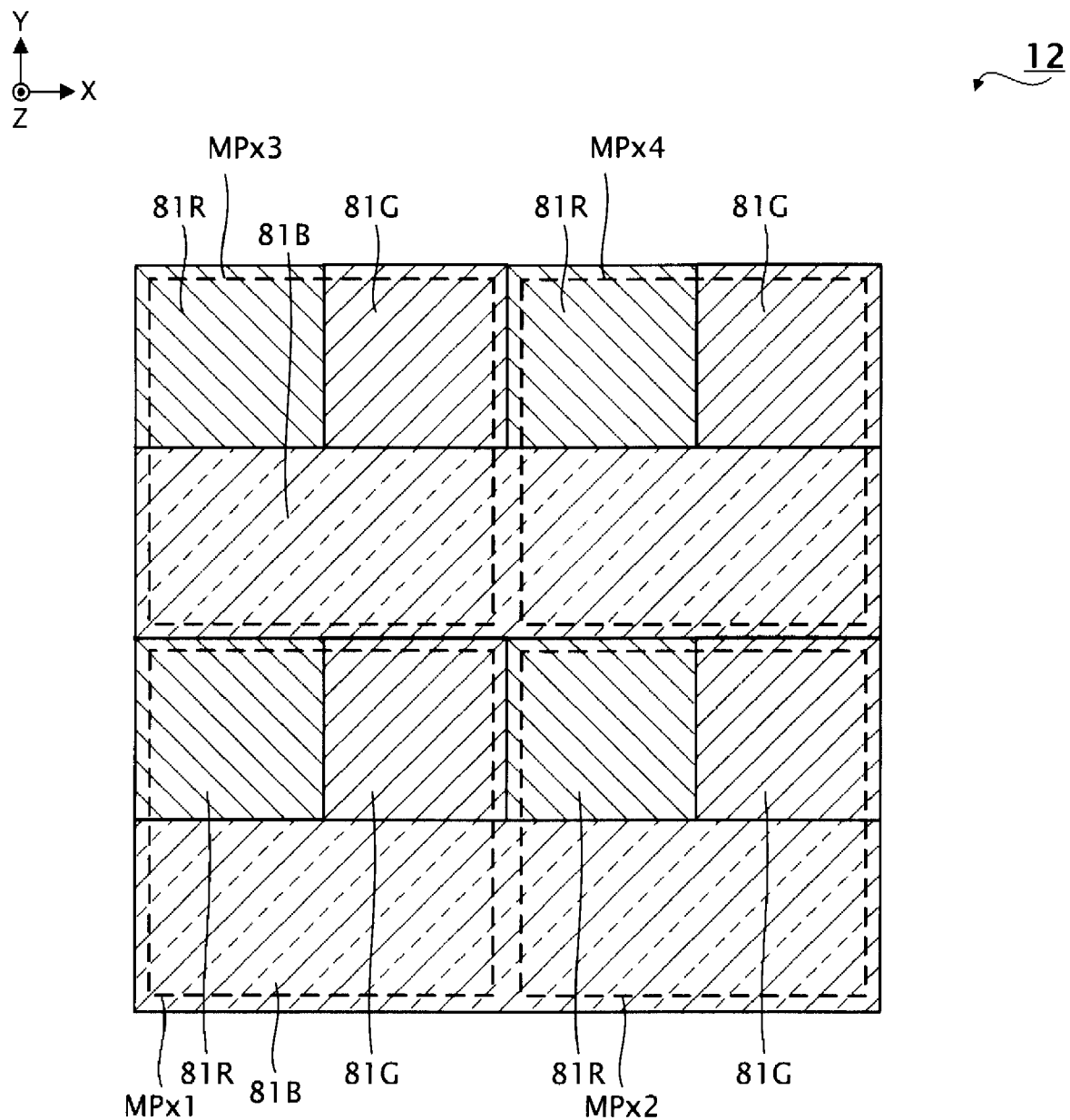
FIG. 13 is a plan view illustrating the third example of the structure of the display 12 in Modified Example 2.

FIG. 13 is a plan view illustrating an example of a schematic structure of the display 12 when a part of the display 12 of Modified Example 2 is viewed in a plan view from the +Z direction. In the plan view of FIG. 13, the color filter 81 of the pixels MPx1 to MPx4 of Modified Example 2 is specifically illustrated.

According to the color change depending on the viewing angle in the X-axis direction, and in Modified Example 2, the relationship between the color of the one sub pixel Px and the color of the sub pixel located adjacent to the above-described one sub pixel in the X direction is uniquely determined in accordance with the color of the above-described one sub pixel. Specifically, the color filter 81 located adjacent to each of the sub pixels PxR of the pixels MPx1 to MPx4 in the +X direction is the color filter 81G. Similarly, the color filter 81 located adjacent to each of the sub pixels PxG of the pixels MPx1 to MPx4 in the +X direction is the color filter 81R. The color filter 81 located adjacent to each of the sub pixels PxB of the pixels MPx1 to MPx4 in the +X direction is the color filter 81B. Accordingly, the color changes depending on the viewing angle in the +X direction are identical to each other. The features in the +X direction are identical in the −X direction.

According to the color change depending on the viewing angle in the Y-axis direction, in Modified Example 2, the relationship between the color of the one sub pixel Px and the color of the sub pixel located adjacent to the above-described one sub pixel in the X direction is uniquely determined in accordance with the color of the above-described one sub pixel. Specifically, the color filter 81 located adjacent to each of the sub pixels PxR of the pixels MPx1 to MPx4 in the +Y direction is the color filter 81B. Similarly, the color filter 81 located adjacent to each of the sub pixels PxG of the pixels MPx1 to MPx4 in the +Y direction is the color filter 81B. The color filter 81 located adjacent to each of the sub pixels PxB of the pixels MPx1 to MPx4 in the +Y direction is color filters 81R or 81G. Accordingly, the color changes depending on the viewing angle in the +Y direction are identical to each other. The features in the +Y direction are identical in the −Y direction.

According to the relationship between the color change depending on the viewing angle in the X-axis direction and the color change depending on the viewing angle in the Y-axis direction, the color filter 81 located adjacent to the sub pixel PxR is, in the X-axis direction, the color filter 81G, while the color filter 81 located adjacent to the sub pixel PxR is, in the Y-axis direction, the color filter 81B. As described above, in Modified Example 2, the color change depending on the viewing angle in the X-axis direction differs from the color change depending on the viewing angle in the Y-axis direction.

Figure 14:
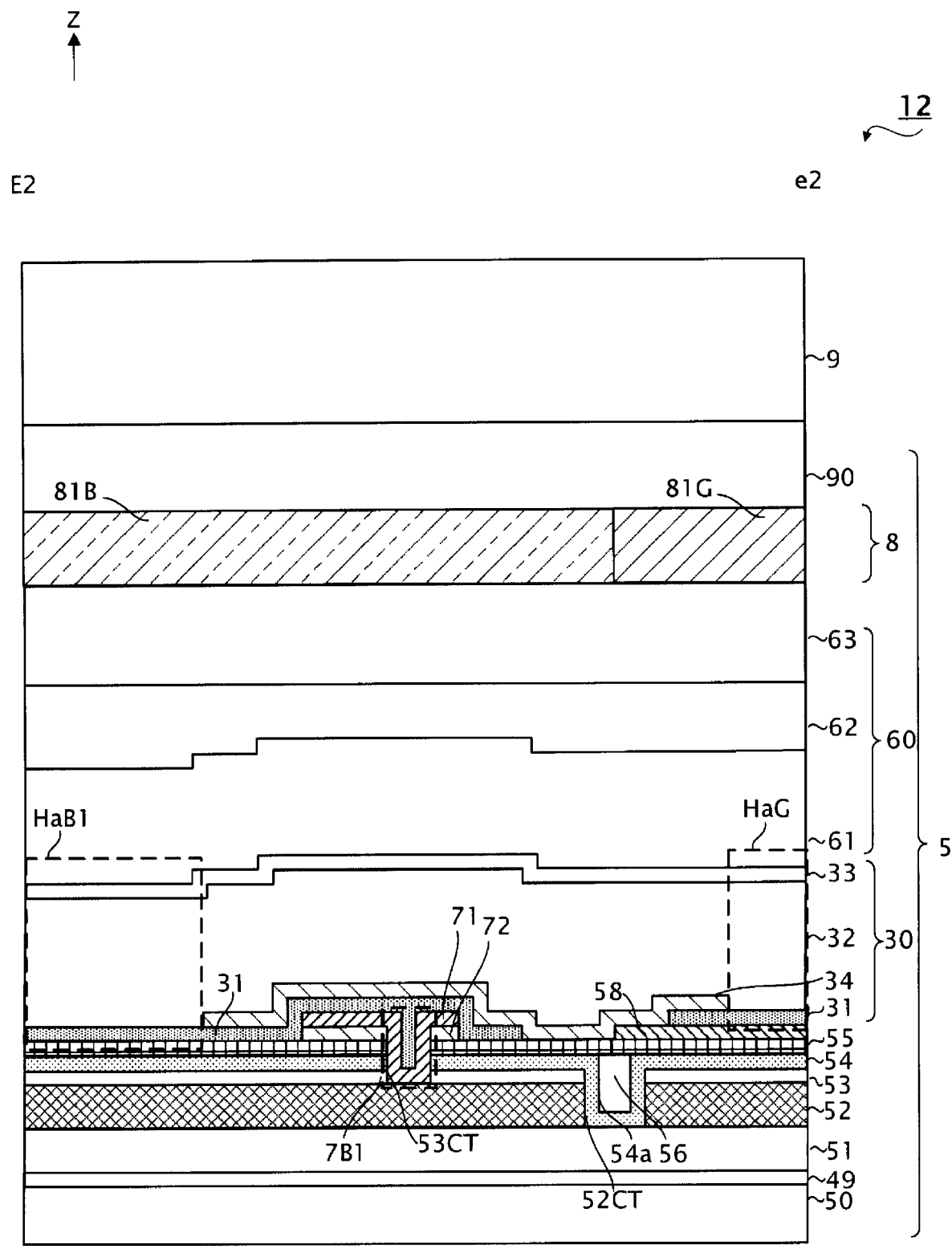
FIG. 14 is a partial cross-sectional view illustrating the first example of the structure of the display 12 in Modified Example 2.

FIG. 14 is an example of a partial cross-sectional view of the display unit 12 in Modified Example 2 taken along line E2-e2 in FIG. 12 of the display 12 in Modified Example 2, and illustrates a cross-sectional surface of the light-emitting element 3B1, a cross-sectional surface of the contact 7B1, and a cross-sectional surface of the light-emitting element 3G. In FIG. 14, there are portions that have been described with reference to FIGS. 7 and 8, and thus the descriptions are omitted.

Figure 15:
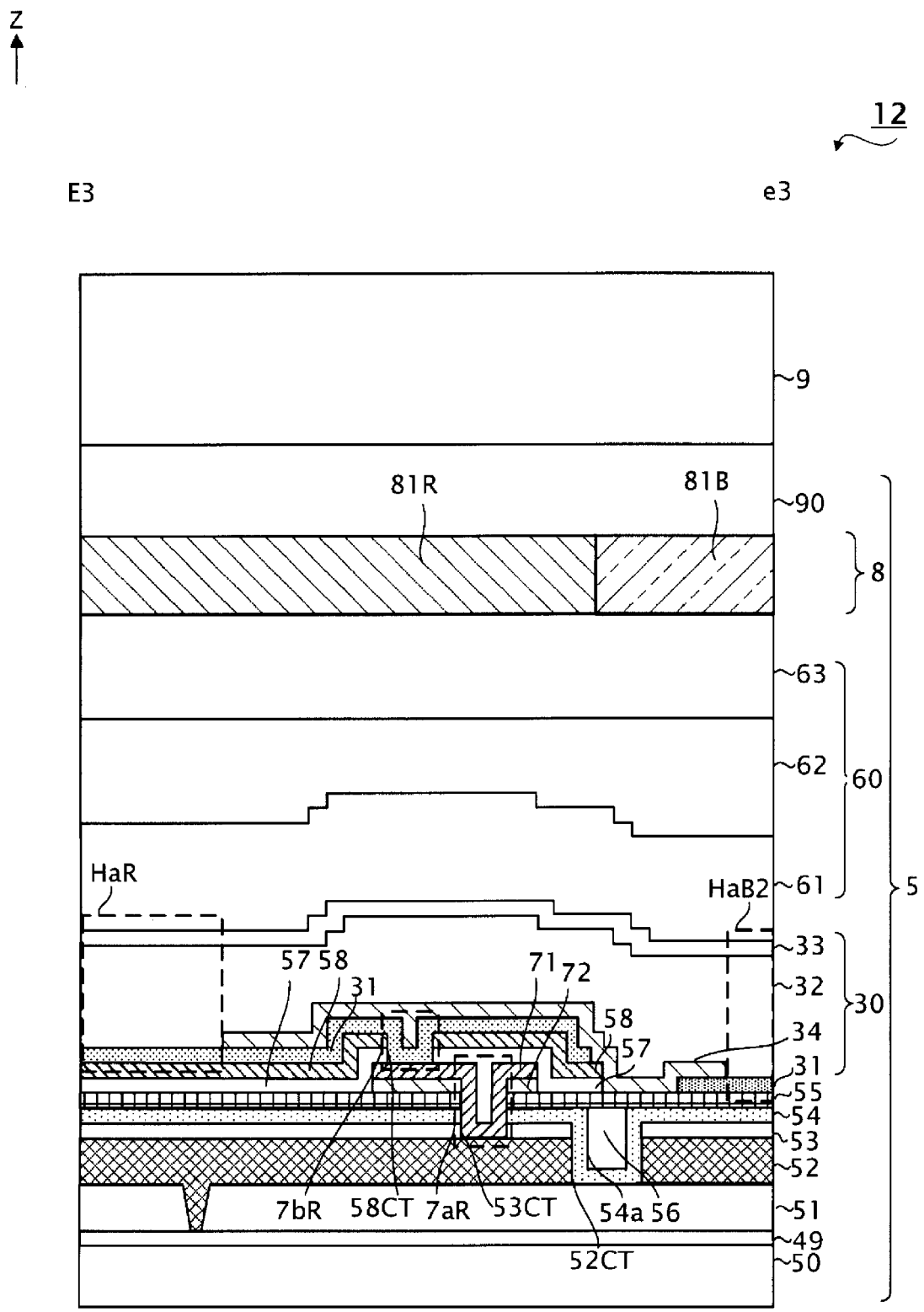
FIG. 15 is a partial cross-sectional view illustrating the second example of the structure of the display 12 in Modified Example 2.

FIG. 15 is an example of a partial cross-sectional view of the display unit 12 in Modified Example 2 taken along line E3-e3 in FIG. 12, and illustrates a cross-sectional surface of the light-emitting element 3R, a cross-sectional surface of the barrier metal-positive electrode contact 7bR, the reflective layer-barrier metal contact 7aR, and a cross-sectional surface of the light-emitting element 3B2. In FIG. 15, the descriptions of the portions that have been described with reference to FIGS. 7 and 8 are omitted.

The contact electrode 71 is layered on the reflective layer 52 and the protective layer 72, and is formed along the gap 53CT. As depicted in FIG. 15, the contact electrode 71 extends along the gap 53CT, and thus the reflective layer-barrier metal contact 7aR is formed. In addition, the pixel electrode 31 is layered on the contact electrode 71 and the second distance adjustment layer 58, and is formed along the gap 58CT.

As depicted in FIG. 15, the pixel electrode 31 extends along the gap 58CT, and thus the barrier metal-positive electrode contact 7bR is formed.

Figure 16:
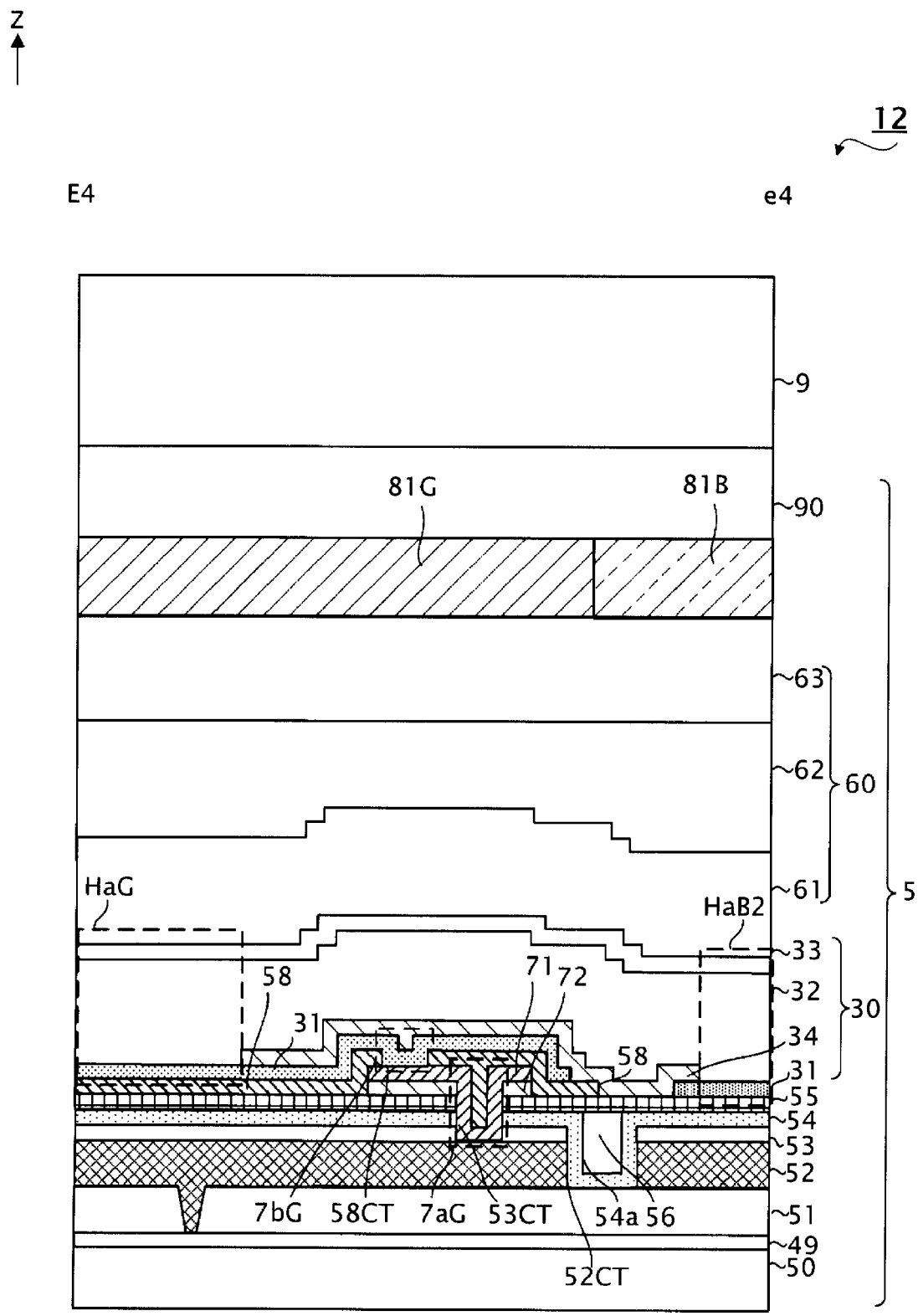
FIG. 16 is a partial cross-sectional view illustrating the third example of the structure of the display 12 in Modified Example 2.

FIG. 16 is an example of a partial cross-sectional view taken along line E4-e4 in FIG. 12 of the display 12 in Modified Example 2, and illustrates the cross-sectional surface of the light-emitting element 3G, a cross-sectional surface of the barrier metal-positive electrode contact 7bG, a cross-sectional surface of the reflective layer-barrier metal contact 7aG, and the cross-sectional surface of the light-emitting element 3B1. In FIG. 16, the descriptions of the portions that have been described with reference to FIGS. 7, 8, 14, and 15 are omitted.

The contact electrode 71 is layered on the reflective layer 52 and the protective layer 72, and is formed along the gap 53CT. As depicted in FIG. 16, the contact electrode 71 extends along the gap 53CT and thus the reflective layer-barrier metal contact 7aG is formed. In addition, the pixel electrode 31 is layered on the contact electrode 71 and the second distance adjustment layer 58, and is formed along a gap 58CT. As depicted in FIG. 16, the pixel electrode 31 extends along the gap 58CT and thus the barrier metal-positive electrode contact 7bG is formed.

MODIFIED EXAMPLE 3

Figure 17:
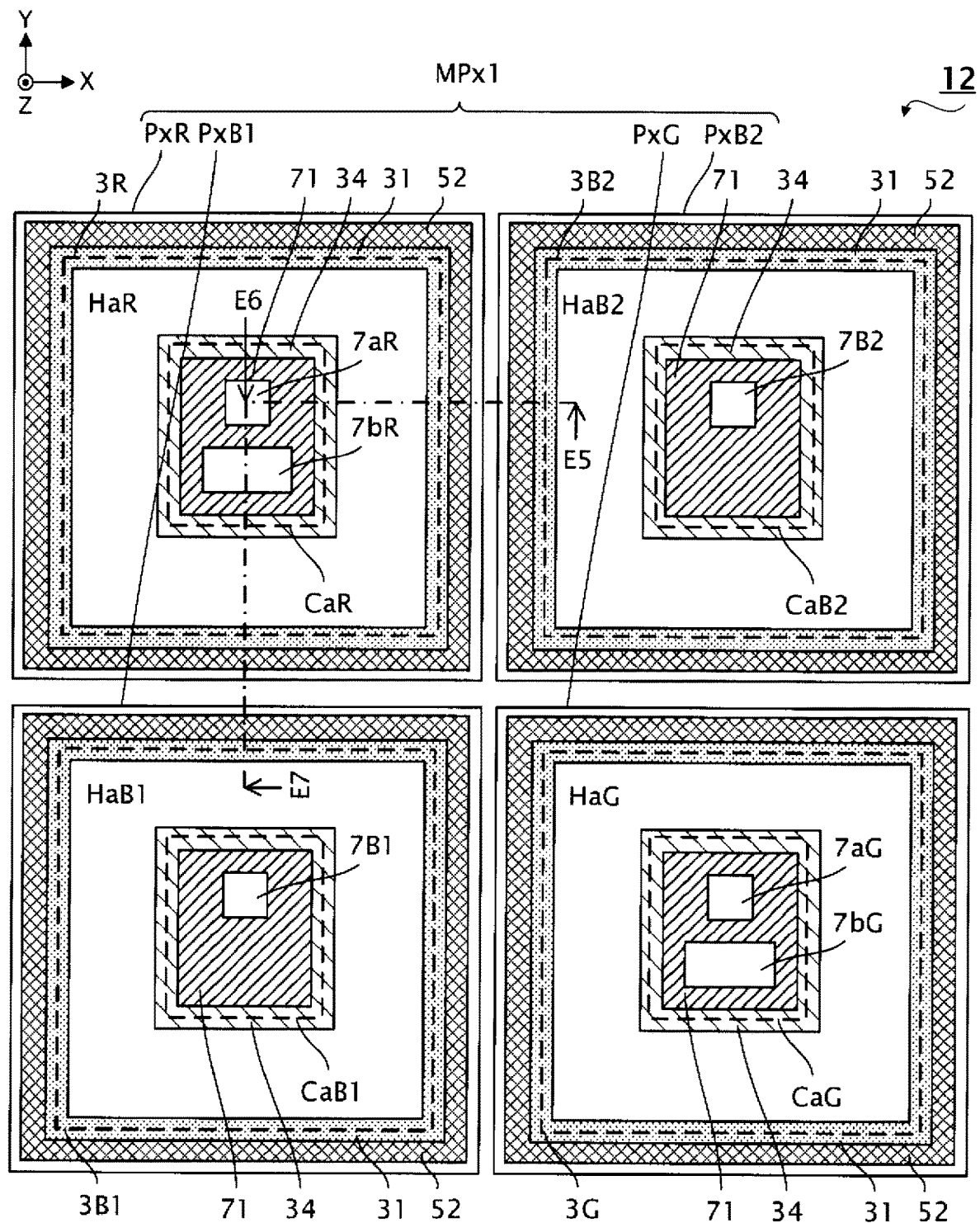
FIG. 17 is a plan view illustrating an example of the structure of the display 12 in Modified Example 3.

FIG. 17 is a plan view illustrating an example of a schematic structure of the display 12 when a part of the display 12 in Modified Example 3 is viewed in a plan view from the +Z direction. Note that the plan view of FIG. 17 is illustrated excluding the color filter 81 to make the drawing more understandable. FIG. 17 illustrates the sub pixel PxR, the sub pixel PxG, the sub pixel PxB1, and the sub pixel PxB2 that form one pixel MPx1. Note that in Modified Example 3, in a plan view from the +Z direction, the structure included in the light-emitting region Ha is taken as the sub pixel Px.

The disposal relationship of each of the sub pixels Px in Modified Example 3 is identical to the disposal relationship of the above-described exemplary embodiments. In addition, each of the sub pixels Px in Modified Example 3 is formed in a rectangular shape, and the contact region Ca in Modified Example 3 is disposed inside the light-emitting region Ha in Modified Example 3. As described above, the contact region Ca is disposed inside the light-emitting region Ha and the contact region Ca is not arrayed outside the light-emitting region Ha, and thus the intervals between the light-emitting regions Ha do not vary due to the presence of the contact region Ca. Accordingly, the variation in color change depending on the viewing angle is suppressed.

According to the viewing angle in the X-axis direction in Modified Example 3, the distance between the light-emitting region HaB1 and the light-emitting region HaG in the pixel MPx1 is substantially equal to the distance between the light-emitting region HaG of the pixel MPx1 and the light-emitting region HaB1 of the pixel MPx located adjacent to the pixel MPx1 in the +X direction. Accordingly, in Modified Example 3, as in the above-described exemplary embodiments, the variation in color change depending on the viewing angle caused by the variation in the distance between the light-emitting regions Ha, in the viewing angle in the X-axis direction, is suppressed. Similarly, the distance between the light-emitting region HaB1 and the light-emitting region HaR of the pixel MPx1 is substantially equal to the distance between the light-emitting region HaG of the pixel MPx1 and the light-emitting region HaB1 of the pixel MPx located adjacent to the pixel MPx1 in the +Y direction. Accordingly, in Modified Example 3, as in the above-described exemplary embodiments, the variation in color change depending on the viewing angle caused by the variation in the distance between the light-emitting regions Ha, in the viewing angle in the Y-axis direction, is suppressed.

In addition, the disposal relationship of each of the sub pixels Px in Modified Example 3 is identical to the disposal relationship of the above exemplary embodiments. Accordingly, the variation in color change depending on the viewing angle in the X-axis direction caused by the color variation of the color filters 81 located adjacent to each other in the X-axis direction, and the variation in color change depending on the viewing angle in the Y-axis direction caused by the color change of adjacent color filters 81 in the Y-axis direction, are suppressed.

In addition, as depicted in FIG. 17, the contact regions Ca in Modified Example 3 are arrayed in the +Y direction. In other words, the direction in which the contact regions Ca are arrayed is inclined at 90 degrees with respect to the +X direction, and the direction in which the contact regions Ca are arrayed is inclined at 0 degrees with respect to the +Y direction. Furthermore, the two contacts 7 are disposed within one contact region Ca, and thus in a similar manner as in the above-described exemplary embodiments, the two contacts 7 are concentrated at one location, and the distance between the two contacts 7 is shortened and the wiring is able to be smoothly performed.

In Modified Example 3, as in the above-described exemplary embodiments, according to the viewing angle in the direction A, the distances between the light-emitting regions Ha of the sub pixels Px and the light-emitting regions Ha of the sub pixels Px located adjacent to the above-described sub pixels Px in the direction A, are constant values.

Accordingly, the variation in color change related to the distance between the light-emitting regions Ha in the viewing angles in the directions A and C is suppressed.

In Modified Example 3, the angle 90 degrees is an example of the "first angle", the angle 0 degrees is an example of the "second angle", and the +Y direction is an example of the "third direction".

Figure 18:
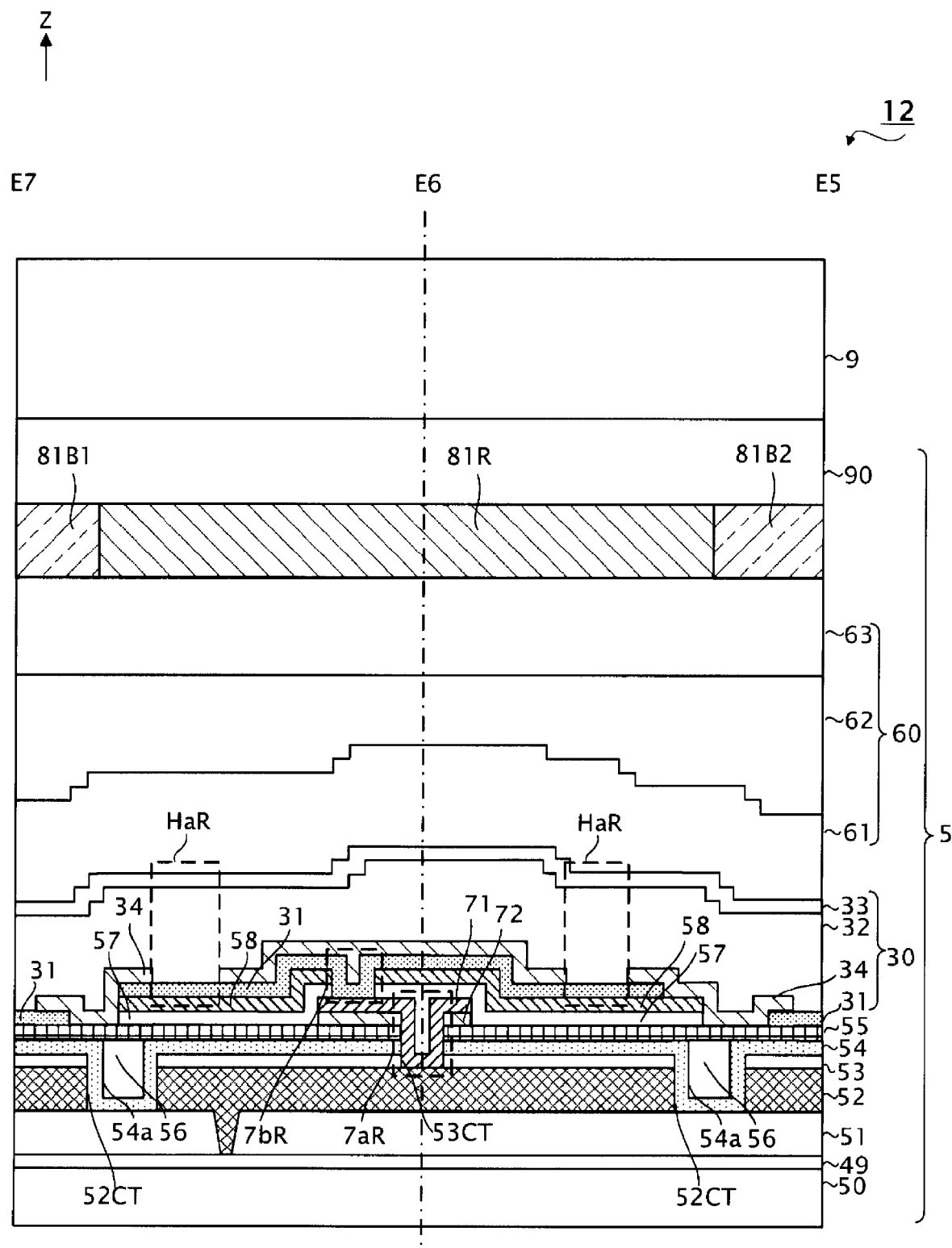
FIG. 18 is a partial cross-sectional view illustrating the example of the structure of the display 12 in Modified Example 3.

FIG. 18 is an example of a partial cross-sectional view taken along line E5-E6-E7 in FIG. 17 of the display 12 in Modified Example 3, and illustrates the cross-sectional surface of the light-emitting element 3B2, the cross-sectional surface of the light-emitting element 3R, the cross-sectional surface of the reflective layer-barrier metal contact 7aR, the cross-sectional surface of the barrier metal-positive electrode contact 7bR and the cross-sectional surface of the light-emitting element 3B1. As depicted in FIG. 17, the light-emitting region Ha is opened by the pixel separation layer 34 in the regions of the pixel electrode 31. In FIG. 18, there are portions that have been described with reference to FIGS. 7, 8, 14, and 15, and thus the descriptions are omitted.

Note that the disposal relationship of the color filter 81 in Modified Example 3 is identical to the disposal relationship of the color filter 81 in the above-described exemplary embodiments, and thus the illustrations are omitted.

MODIFIED EXAMPLE 4

Figure 19:
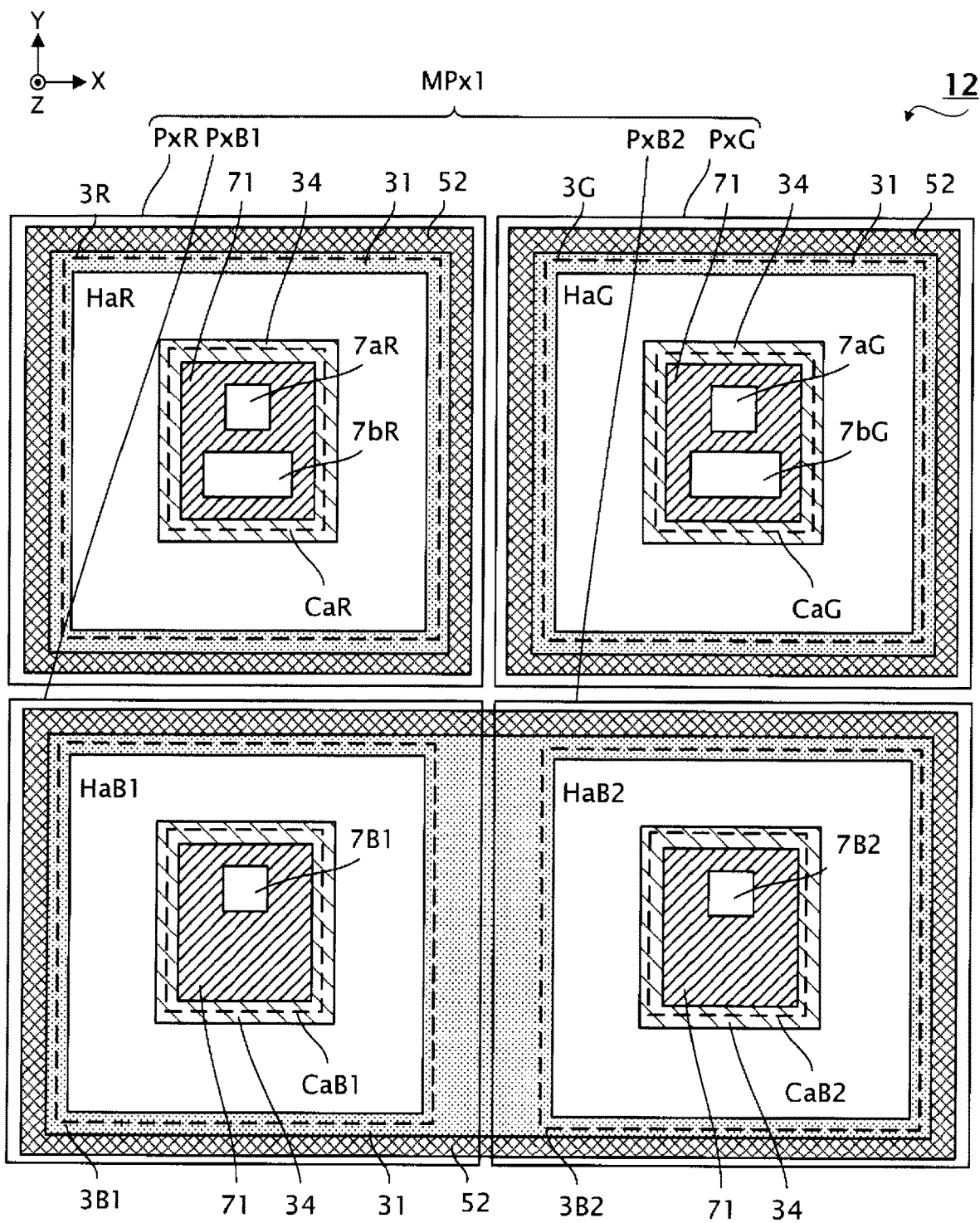
FIG. 19 is a plan view illustrating an example of the structure of the display 12 in Modified Example 4.

FIG. 19 is a plan view illustrating an example of a schematic structure of the display 12 when a part of the display 12 in Modified Example 4 is viewed in a plan view from the +Z direction. Note that the plan view of FIG. 19 is illustrated excluding the color filter 81 to make the drawing more understandable. FIG. 19 illustrates the sub pixel PxR, the sub pixel PxG, the sub pixel PxB1, and the sub pixel PxB2 that form one pixel MPx1. Note that, in Modified Example 4, as in Modified Example 3, the structure included in the light-emitting region Ha in a plan view from the +Z direction is taken as the sub pixel Px.

The disposal relationship of each of the sub pixels Px in Modified Example 4 is identical to the disposal relationship of Modified Example 2. The sub pixel PxB1 is connected to the sub pixel PxB2 in the reflective layer 52 and the pixel electrode 31. In addition, each of the sub pixels Px in Modified Example 4 is formed in a rectangular shape in the same manner as Modified Example 3. In a similar manner as in Modified Example 3, the contact region Ca in Modified Example 4 is disposed inside the light-emitting region Ha in Modified Example 4.

Note that the disposed location of the color filter 81 in Modified Example 4 is identical to the disposed location of the color filter 81 in Modified Example 2, and thus the illustrations are omitted.

MODIFIED EXAMPLE 5

Figure 20:
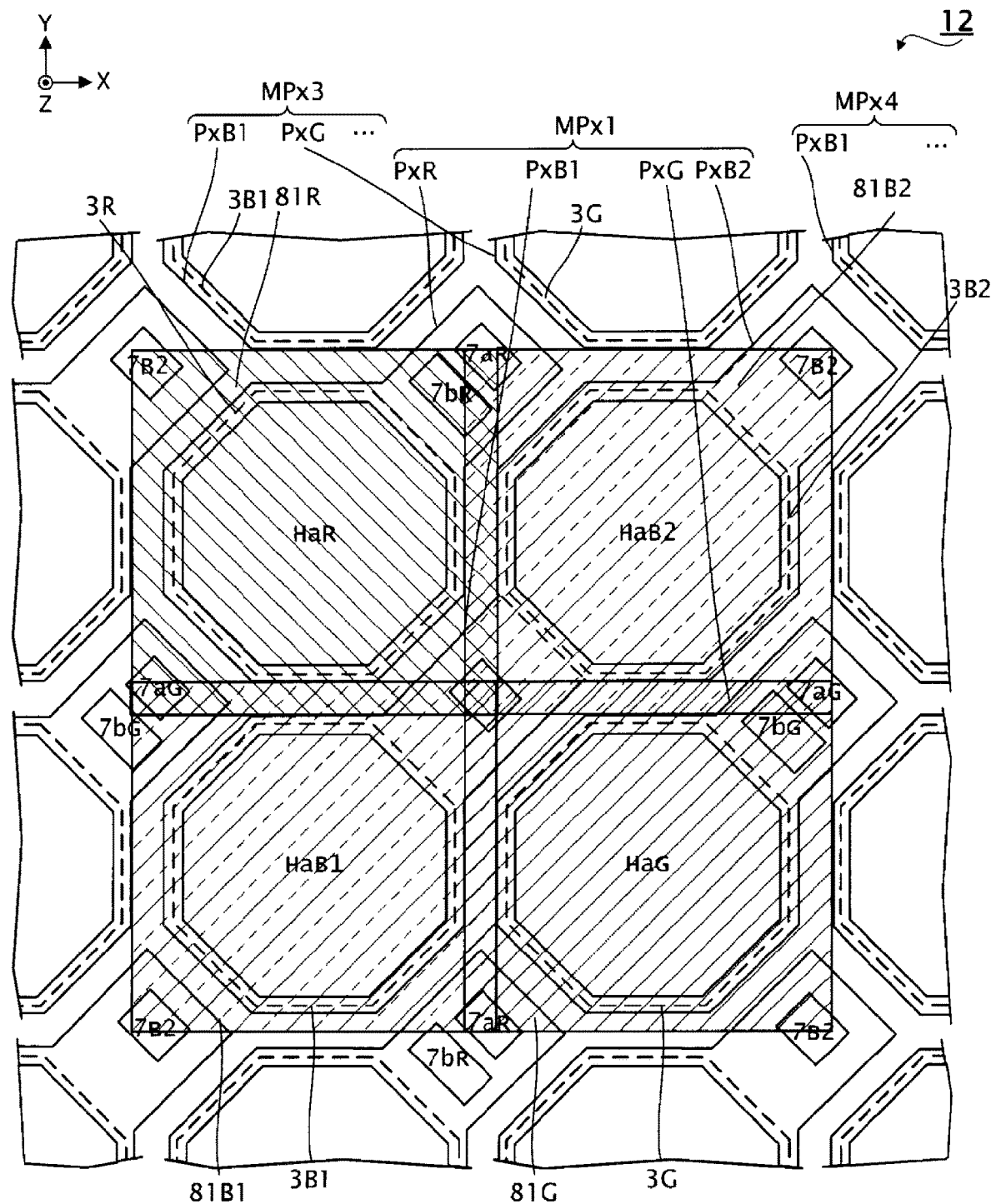
FIG. 20 is a plan view illustrating an example of the structure of the display 12 in Modified Example 5.

FIG. 20 is a plan view illustrating an example of a schematic structure of the display 12 when a part of the display 12 in Modified Example 5 is viewed in a plan view from the +Z direction.

Note that, the plan view of FIG. 20 is illustrated excluding the contact region Ca to make the drawing more understandable.

In one exemplary embodiment, the color filters 81 do not overlap with each other, while in Modified Example 5, a part of the color filter 81 overlaps with a part of another color filter 81. In FIG. 20, features excluding the color filter 81 are identical to the features in the above-described exemplary embodiments. Even when a part of the color filter 81 overlaps with a part of another color filter 81, in one of the X-axis direction and the Y-axis direction, the distances between the end portion of the color filter 81 and the light-emitting region Ha adjacent to the corresponding color filter 81 in one of the X-axis direction and the Y-axis direction, are equal to each other. The aspect in which a part of the color filter 81 overlaps with a part of another color filter 81 is not limited to the exemplary embodiment, and is able to be applied to any of Modified Example 1, Modified Example 2, Modified Example 3, and Modified Example 4.

Other Modified Examples

In the above-described exemplary embodiments, the +X direction as an example of the first direction is orthogonal to the +Y direction as an example of the second direction, and the first direction may be simply intersected by the second direction. For example, even when the array of the sub pixels Px is the so-called delta-array, the above is applicable. Further, in a plan view from the +Z direction, the light-emitting regions Ha in the exemplary embodiments, Modified Example 1, and Modified Example 2 are octagonal, and the shape is not limited to being octagonal and may be circular. Further, the width and the height of the light-emitting region Ha may be equal to each other or may be different from each other. Further, in the exemplary embodiments, Modified Example 1, and Modified Example 3 as described above, the sub pixels PxB are arrayed in the direction A, and the sub pixels PxB may be arrayed in the direction D. Furthermore, in Modified Example 2 and Modified Example 4, the sub pixels PxB are arrayed in the X-axis direction, and the sub pixels PxB may be arrayed in the Y-axis direction.

APPLICATION EXAMPLES

The electro-optical device 1 of the exemplary embodiments and the modified examples described above is able to be applied to various electronic devices. Hereafter, electronic devices according to the disclosure will be described.

Figure 21:
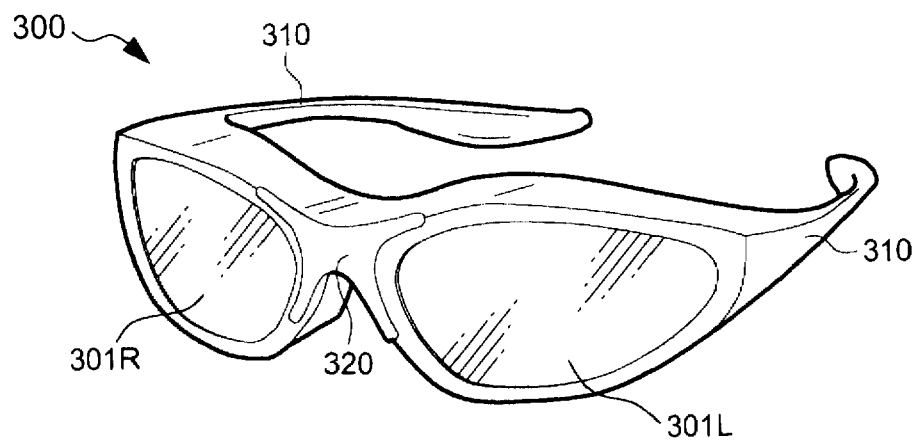
FIG. 21 is a perspective view illustrating a head mounted display 300 according to the disclosure.
Figure 22:
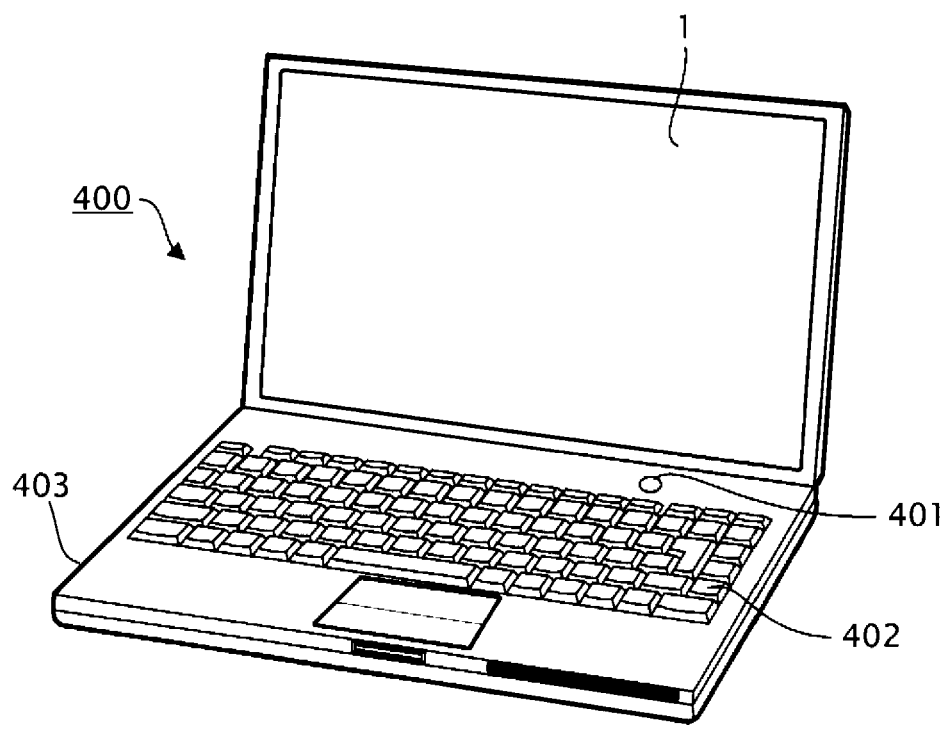
FIG. 22 is a perspective view illustrating a personal computer 400 according to the disclosure.

FIG. 21 is a perspective view illustrating the external appearance of a head mounted display 300 as an electronic device that employs the electro-optical device 1 of the disclosure. As depicted in FIG. 21, the head mounted display 300 includes a temple 310, a bridge 320, a projection optical system 301L, and a projection optical system 301R. Furthermore, in FIG. 21, an electro-optical device 1 (not depicted) for the left eye is provided behind the projection optical system 301L, and an electro-optical device 1 (not depicted) for the right eye is provided behind the projection optical system 301R. FIG. 22 is a perspective view of a portable personal computer 400 that employs the electro-optical device 1. The personal computer 400 includes the electro-optical device 1 for displaying various images, and a main body portion 403 provided with a power switch 401 and a keyboard 402. Note that the electronic devices to which the electro-optical device 1 according to the disclosure is applied, include, in addition to the devices exemplified in FIGS. 21 and 22, mobile phones, smartphones, personal digital assistants (PDAs), digital still cameras, televisions, video cameras, car navigation devices, in-vehicle display devices (instrument panels), electronic notebooks, electronic papers, electronic calculators, word processors, workstations, video phones, POS terminals, and the like. Furthermore, the electro-optical device 1 according to the disclosure is able to be applied as a display provided in an electronic device, such as a printer, a scanner, a copying machine, and a video player.

The entire disclosure of Japanese Patent Application No. 2017-147405, filed Jul. 31, 2017 is expressly incorporated by reference herein.

What is claimed is:

1. An electro-optical device, comprising:
a first pixel electrode;
a second pixel electrode disposed apart from the first pixel electrode in plan view;
a first contact electrode electrically connected to the first pixel electrode through a first contact hole;
a first color filter disposed so as to overlap with the first pixel electrode;
a second color filter disposed so as to overlap with the first pixel electrode, the second pixel electrode, and the first contact electrode.

2. The electro-optical device according to claim 1, further comprising:
a second contact electrode electrically connected to the second pixel electrode through a second contact hole;
a third pixel electrode disposed apart from the second pixel electrode in plan view; and
a third color filter disposed so as to overlap with the second pixel electrode, the third pixel electrode, and second contact electrode.

3. The electro-optical device according to claim 2, further comprising:
a light-emitting function layer disposed between the first pixel electrode and the first color filter, disposed between the second pixel electrode and the second color filter, and disposed between the third pixel electrode and the third color filter.

4. The electro-optical device according to claim 1, wherein
the second color filter overlaps with the first contact hole.

5. The electro-optical device according to claim 2, wherein
the third color filter overlaps with the second contact hole.

* * * * *